United States Patent
Das et al.

(10) Patent No.: US 11,967,629 B2
(45) Date of Patent: Apr. 23, 2024

(54) LOW NOISE AND HIGH-PERFORMANCE FIELD EFFECT TRANSISTORS OF 2-DIMENSIONAL MATERIALS AND METHODS TO FABRICATE THE SAME

(71) Applicants: Kansas State University Research Foundation, Manhattan, KS (US); Purdue Research Foundation, West Lafayette, IN (US)

(72) Inventors: Suprem R. Das, Manhattan, KS (US); David B. Janes, West Lafayette, IN (US); Jiseok Kwon, Lafayette, IN (US)

(73) Assignees: Kansas State University Research Foundation, Manhattan, KS (US); Purdue Research Foundation, West Lafayette, IN (US)

( * ) Notice: Subject to any disclaimer, the term of this patent is extended or adjusted under 35 U.S.C. 154(b) by 588 days.

(21) Appl. No.: 17/253,180

(22) PCT Filed: Jun. 22, 2019

(86) PCT No.: PCT/US2019/038619
§ 371 (c)(1),
(2) Date: Dec. 17, 2020

(87) PCT Pub. No.: WO2019/246601
PCT Pub. Date: Dec. 26, 2019

(65) Prior Publication Data
US 2021/0280685 A1 Sep. 9, 2021

Related U.S. Application Data

(60) Provisional application No. 62/688,780, filed on Jun. 22, 2018.

(51) Int. Cl.
*H01L 21/02* (2006.01)
*H01L 29/24* (2006.01)
(Continued)

(52) U.S. Cl.
CPC ...... *H01L 29/435* (2013.01); *H01L 21/02568* (2013.01); *H01L 29/24* (2013.01); *H01L 29/66969* (2013.01); *H01L 29/7606* (2013.01)

(58) Field of Classification Search
CPC . H01L 29/435; H01L 21/02568; H01L 29/24; H01L 29/66969; H01L 29/7606; H01L 29/78681; H01L 29/778
See application file for complete search history.

(56) References Cited

U.S. PATENT DOCUMENTS

| | | |
|---|---|---|
| 7,633,130 B2 | 12/2009 | Marks et al. |
| 9,455,365 B1 | 9/2016 | Balicas et al. |
| 9,608,101 B2 | 3/2017 | Kis et al. |

FOREIGN PATENT DOCUMENTS

WO   WO-2019132910 A1 *  7/2019  ..... H01L 21/823814

OTHER PUBLICATIONS

International Search Report and Written Opinion in corresponding PCT/US2019/038619, dated Nov. 5, 2019.
(Continued)

*Primary Examiner* — Jung Kim
(74) *Attorney, Agent, or Firm* — Hovey Williams LLP

(57) ABSTRACT

A semiconductor device and methods of fabricating and using the same are provided. The semiconductor device comprises a channel region and at least a first, second, and third electrode. The channel region includes a compound having a transition metal and a chalcogen. The thickness of the channel region is about 3 to about 40 atomic layers.

19 Claims, 33 Drawing Sheets

(51) Int. Cl.
*H01L 29/43* (2006.01)
*H01L 29/66* (2006.01)
*H01L 29/76* (2006.01)

(56) References Cited

OTHER PUBLICATIONS

Rumyantsev, et al., "Low-Frequency 1/f Noise in MoS2 Thin-Film Transistors: Comparison of Single and Multilayer Structures", Mar. 6, 2015, https://arxiv.org/abs/1503.01823.

\* cited by examiner

LOW NOISE AND HIGH-PERFORMANCE FIELD EFFECT TRANSISTORS OF 2-DIMENSIONAL MATERIALS AND METHODS TO FABRICATE THE SAME

CROSS-REFERENCE TO RELATED APPLICATIONS

The present application is the U.S. National Stage of International Patent Application No. PCT/US2019/038619, filed Jun. 22, 2019, which claims the priority benefit of U.S. Provisional Patent Application Ser. No. 62/688,780, filed Jun. 22, 2018, entitled LOW NOISE AND HIGH-PERFORMANCE FIELD EFFECT TRANSISTORS OF 2-DIMENSIONAL MATERIALS AND METHODS TO FABRICATE THE SAME, each of which is incorporated by reference in its entirety herein.

STATEMENT REGARDING FEDERALLY SPONSORED RESEARCH OR DEVELOPMENT

This invention was made with government support under contract DE-NA0003525 awarded by the U.S. Department of Energy (DOE) and under grant ECCS-1408346 awarded by the National Science Foundation (NSF). The government has certain rights in the invention.

BACKGROUND OF THE INVENTION

Field of the Invention

The present invention is generally directed toward atomically-thin electronic devices fabricated from 2-dimensional (2D) materials in a systematic manner.

Description of the Prior Art

The silicon (Si) transistor has been the primary component used in microelectronics for decades (starting from 1950's, and even before). It has revolutionized the way we live today. But continued scaling of its size down to few tens of nanometer has diminished its future potential. Industry and researchers have identified several problems that may create roadblocks for continued use of silicon electronics in the upcoming years. First, the Si transistor cannot be made smaller (for sustaining Moore's law) as it is hitting the physical limit. Second, the high leakage problem (called the "gate leakage") is causing enormous heating issues in the microprocessor. Third, Si electronics are not able to sustain the low power requirement to keep pace with high-performance computing. Fourth, it cannot fulfill the "Moore-than-Moore" requirements (a key framework for applications such as IoT). Fifth, it is not suitable for flexible and bendable electronics.

Among emerging materials and device research, 2D materials could be achieved truly in atomic resolution. They have shown initial success to qualify as a better transistor, but there needs to be tight scrutiny to fully recognize their potential. While 2D electronic devices demonstrate workable electrostatic control and ON/OFF ratios, a clear correlation between electronic transport and the low-frequency noise with varying atomic layer thickness is unknown. For multi-layer channels in field-effect transistors (FETs), there is limited understanding of interlayer effects in consideration of the intrinsic (channel) and extrinsic (total device) noise behavior. One stringent requirement is low-frequency noise (1/f noise) characteristics and how to control them in 2D transistors.

Low-frequency (1/f) noise, a ubiquitous phenomenon in every electronic device, is not well understood, optimized, or correlated to transport features in 2D FET devices. Low-frequency noise can have significant implications on circuits and systems (such as circuits for radio-frequency (RF) communications). The noise properties are dependent on the interaction of carriers with the channel/dielectric interface states as well as the contact and access-region properties, including inter-atomic layer coupling.

Two-dimensional van der Waal channel materials, such as graphene, are expected to show unique noise characteristics due to the existence of interlayer resistances between the individual ultra-thin channel layers and the presence of grain-boundaries as transport barriers in case of large scale 2D channels. Indeed, some of these features have been demonstrated in noise characteristics: for example, the contrasting nature of 1/f noise in single layer graphene (SLG) and bilayer graphene (BLG) has been interpreted in terms of their unique band structure. In general, it has been found that noise behavior is different in strong versus weak "inversion" regimes and that increased layer thicknesses yield lower noise than single/few layer devices.

SUMMARY OF THE INVENTION

With the number of atomic layer variation of the channel (3 atomic layers to ~40 atomic layer variation), the present invention achieves an optimum layer thickness in FET devices where the lowest noise, the highest mobility, and the lowest contact resistance are obtained simultaneously. Such optimized devices are key to achieve a number of applications such as high performance and reliable nano-switches, sensors, and biosensors.

In one embodiment, the present invention is directed toward a semiconductor device comprising a channel region and at least a first, second, and third electrode in contact with the channel region. The channel region comprises about 3 to about 40 atomic layers, and preferably about 8 to about 20 atomic layers, of a compound having a transition metal and a chalcogen. Preferred transition metals include molybdenum and tungsten. Preferred chalcogens include selenium and sulfur. Preferred compounds making up the channel region include $MoS_2$, $MoSe_2$, $WS_2$, and $WSe_2$. In certain embodiments, the channel region may have a thickness that is less than 15 nm, and preferably less than 10 nm.

In particular embodiments, the first and second electrodes may be positioned on a first surface of the channel region and may include electrode material comprising a transition metal, such as scandium, nickel, tungsten, etc. The electrode material is preferably chosen based on optimization of intrinsic metal-semiconductor energy barrier with the channel material. In particular, the electrode material is selected so as to provide a minimum energy barrier. In a particularly preferred embodiment, the channel region may include about 15 atomic layers of $MoSe_2$ and the electrode material includes scandium. A resistive layer is in contact with a second surface of the channel region opposing the first surface and comprises an electrically-resistive material, such as an oxide or nitride, including silicon dioxide, aluminum oxide, hafnium oxide, and boron nitride. The third electrode is in contact with the resistive layer and comprises doped silicon. The resistive layer may be in direct contact with the second surface of the channel region.

In one embodiment, the semiconductor device is a back-gated field effect transistor. In such an embodiment, the two-dimensional semiconductor device may be connected to a voltage source that provides a bias voltage between the pair of electrodes. The bias voltage may be from about 50 mV to about 500 mV. In a preferred embodiment, the bias voltage is about 200 mV.

In another embodiment, the present invention is directed toward a semiconductor device comprising a channel region having a first surface and a second surface, a first electrode and a second electrode in contact with the first surface of the channel region, a resistive layer in contact with the second surface of the channel region, and a third electrode in contact with the resistive layer. The channel region comprises a compound having a transition metal and a chalcogen. The chalcogen comprises a material selected from the group consisting of: selenium and sulfur. The channel region has a thickness of about 3 to about 40 atomic layers, and preferably about 8 to about 20 atomic layers.

In another embodiment, the present invention is directed toward a method of forming a semiconductor device comprising forming a material that comprises at least 3 but no more than 40 atomic layers of a compound material, and preferably at least 8 but no more than 20 atomic layers of a compound material; placing a polymer layer on a first surface of the material; forming at least two windows in the polymer layer by removing at least two portions of the polymer layer; exposing the material to vacuum conditions; and depositing contact metal in the at least two windows on the first surface to form at least first and second electrodes. The material comprises a transition metal and a chalcogen. In some embodiments, the method may include positioning the material in contact with a resistive layer. A third electrode comprising a positively heavily doped silicon layer may be in contact with the resistive layer. The transition metal may include molybdenum or tungsten, and the chalcogen may include selenium or sulfur, as described above. The forming step may include chemical vapor deposition. In one embodiment, the forming step includes chemical or mechanical exfoliation. The chemical exfoliation may include sonication-assistance, in which the source material is dispersed into a liquid, such as an organic solvent or an acid. The exfoliated nanosheets may be characterized by atomic force microscopy and Raman spectroscopy to determine the number of atomic layers present in the exfoliated sheets. The electrodes may be any electrode material described herein, however, scandium, nickel, and molybdenum are preferred.

In another embodiment, the present invention is directed toward a method of forming a semiconductor device comprising using chemical vapor deposition to form a material comprising a transition metal and a chalcogen; and placing at least first, second, and a resistive layer in contact with the material, and a third electrode in contact with the resistive layer.

In another embodiment, the present invention is directed toward a method of providing a conductive path. The method comprises providing a semiconductor device having a channel region, a first electrode, a second electrode, a resistive layer, and a third electrode. The channel region has a first surface and a second opposed surface and comprises a compound having a transition metal and a chalcogen. The first electrode and the second electrode are in contact with the first surface of the channel region. The resistive layer is in contact with the second surface of the channel region, and the third electrode is in contact with the resistive layer. The channel region has a thickness of about 3 to about atomic layers, and preferably about 8 to about 20 atomic layers. The method further comprises applying a biasing voltage of about 20 to about 500 mV between the first electrode and the second electrode; and applying a gate voltage between the third electrode and the second electrode.

A method of detecting a channel noise within the signal of a semiconductor device including applying a biasing voltage across a first electrode and a second electrode and simultaneously sweeping a voltage across a third electrode and the second electrode; measuring a frequency-dependent signal at the second electrode between 1 Hz and 1 kHz; detecting a signal of a channel region of the semiconductor device; filtering out the random signal from the signal of the device to obtain a contact noise signal; performing similar measurements at higher gate voltage to determine contact noise signal; filtering out the contact noise signal from device noise signal to obtain the channel noise signal. The third electrode may be a gate region, the first electrode may be a source region, and the second electrode may be a drain region, wherein the biasing voltage is at least 20 mV and less than 500 mV. A second biasing voltage may be applied across the semiconductor device from the gate region to the source region that is at least 5 V higher than a threshold voltage. In a preferred embodiment, the first biasing voltage is 50 mV and the second biasing voltage is 7 V.

BRIEF DESCRIPTION OF THE DRAWINGS

FIG. 2(a) illustrates transfer characteristics measured at $V_{ds}$=0.2V.

FIGS. 13(b), (d), (f), (h) and (j) illustrate contact and channel components of the resistance noise power density and resistance for $MoSe_2$ FET, obtained from measurements using procedure described in text. The shaded area represents the "transition regime" in which channel dominates noise but contact/access regions dominate resistance. FIGS. 13(a), (b) are for 3 L; FIGS. 13(c), (d) are for 5 L; FIGS. 13(e), (f) for 8 L; FIGS. 13(g), (h) are for 10 L; and FIGS. 13(i), (j) are for 20 L.

Figure 1A:
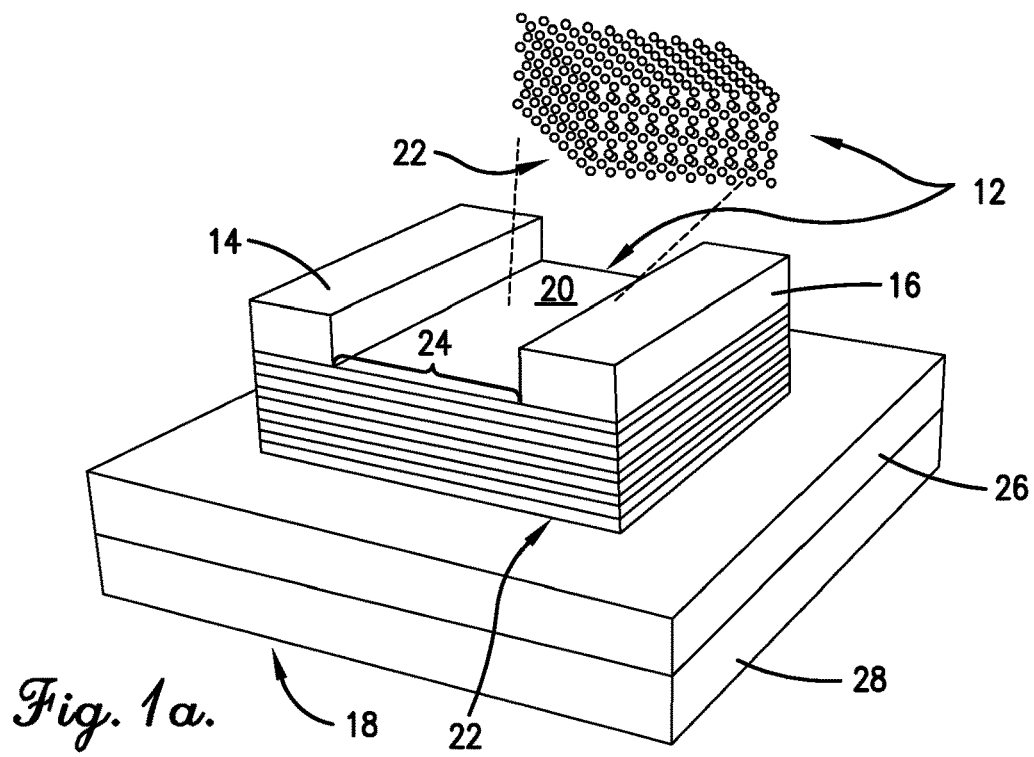
FIG. 1(a) is a schematic view of $MoSe_2$ field-effect transistor employed in the present work. $MoSe_2$ flakes with various numbers of atomic layers were used as transistor channels. The nickel S/D contact electrodes are fabricated on top of the back-gated channel.

The drawing figures do not limit the present invention to the specific embodiments disclosed and described herein. The drawings are not necessarily to scale, emphasis instead being placed upon clearly illustrating the principles of the invention.

DETAILED DESCRIPTION OF THE PREFERRED EMBODIMENT

Two-dimensional transistors made from materials such as $MoS_2$, $MoSe_2$, $WS_2$, $WSe_2$, etc. have high ON- to OFF-current ratio (typically a million or more for a best quality switch). But, their 1/f noise characteristics are not well known and systematically characterized with the atomic resolution. Further, such 2D transistors have not been optimized in terms of their atomic layer numbers, a key to access their potential for high performance and low noise transistors. If known, the device itself could be used as a high precision sensor in electronics and bioelectronics.

In certain embodiments of the present invention, a process has been developed to fabricate these devices that show low noise, high mobility, low contact resistance—all tied up with the number of atomic layers and their control. Also, the present invention pertains to a method to discriminate the noise coming from the 2D material vs. from the metal that is often associated in a transistor device, providing the absolute nature of the noise. Embodiments of the present invention also include 2D semiconductor devices having channel regions having thicknesses of about 3 to about 40 atomic layers, and preferably about 8 to about 20 atomic layers, while achieving the highest mobility of electrons, lowest resistance to conduct current, and possessing the lowest noise. The channel region may comprise $MoS_2$ as well as MoSe$_2$. Embodiments of the present invention use various metals, such as chromium/gold, nickel, molybdenum, and scandium, as electrodes in the 2D transistors. Embodiments of the present invention have demonstrated that the transistor characteristics, including 1/f noise are also very much dependent on the metals used. Although nickel and molybdenum show high performance characteristics, the best performance (highest mobility and lowest noise) have been observed with scandium metal. See, FIGS. 7-10.

The 1/f noise properties in MoSe$_2$ FETs with varying channel thickness (3 to 40 atomic layers) are described herein. Contributions of channel vs. access/contact regions were extracted from current-voltage (transport) and 1/f noise measurements. The measured noise amplitude shows a direct crossover from channel- to contact-dominated noise as the gate voltage is increased. The results can be interpreted in terms of a Hooge relationship associated with the channel noise, a transition region, and a saturated high-gate voltage regime whose characteristics are determined by a voltage-independent conductance and noise source associated with the metallurgical contact and the interlayer resistance. Both the channel Hooge coefficient and the channel/access noise amplitude decrease with increasing channel thickness over the range of 3 to 15 atomic layers, with the former remaining approximately constant and the latter increasing over the range of 20 to 40 atomic layers. The analysis can be extended to devices based on other TMDCs.

Preferred embodiments of the present invention include multilayer MoSe$_2$ FET devices with channels of various atomically controlled thicknesses. Analogous to MoS$_2$, MoSe$_2$ shows tunable energy gap and crossover from indirect to direct bandgap in the monolayer limit. However, in certain observations associated with the present invention, MoSe$_2$ FETs have shown higher ambient stability for prolonged duration with minimal hysteresis during forward and reverse bias conditions. In particular embodiments, several other unique characteristics of MoSe$_2$ over MoS$_2$ have been observed: (1) degenerate indirect and direct bandgap with decoupling of bulk and 2D limit; (2) angle resolved photoemission spectroscopy (ARPES) shows the dispersion of the valence bands decreases along $k_\parallel$ and $k_\perp$ directions, indicating increased 2D character (or increased interlayer distance); (3) MoSe$_2$ shows much weaker bound exciton peak compared to MoS$_2$, therefore, having a faster photo-response time (~three orders of magnitude faster; 25 ms compared to <30 s for MoS$_2$) than MoS$_2$, indicating potential application in efficient phototransistors; and (4) the atomic defects (Mo—Se defects) in MoSe$_2$ are reported to be less significant than the Mo—S defects in MoS$_2$. These properties, along with observed transistor characteristics, make MoSe$_2$, a promising material for nanoelectronic and optoelectronic device applications. However, none of the foregoing should be taken as diminishing the use of MoS$_2$ in embodiments of the present invention.

Embodiments of the present invention demonstrate current-voltage relationships and gate-bias dependent 1/f noise in MoSe$_2$ transistors with channel thicknesses varying from 3 to 40 atomic layers. For a given layer thickness, the gate-bias dependences of both the conductance and noise at low drain fields (linear regime) can be understood in terms of noise contributions and conductance from the channel and contact/access regions. The model developed in embodiments of the present invention can fit voltage dependence without the need to assume a voltage-variable noise mechanism within the channel. Additionally, the voltage dependence can be fit by a model considering a transition from channel-dominated noise to contact-dominated noise, and that a single noise mechanism is satisfactory to explain the channel contribution to noise. Comparison of properties of devices with varying layer thicknesses allows both qualitative and quantitative comparison of the intrinsic channel properties (mobility and Hooge parameter) and the contributions from the contact and interlayer coupling resistances. As the layer thickness increases over the range of 3-15 monolayers the mobility increases and noise amplitude decreases, consistent with decreasing interactions between carriers and interface states. For thickness of 20 layers and beyond, increasing layer thickness leads to decreased extrinsic mobility and increased noise amplitude, associated with increased series resistance involved with interlayer coupling resistance.

Figure 1B:
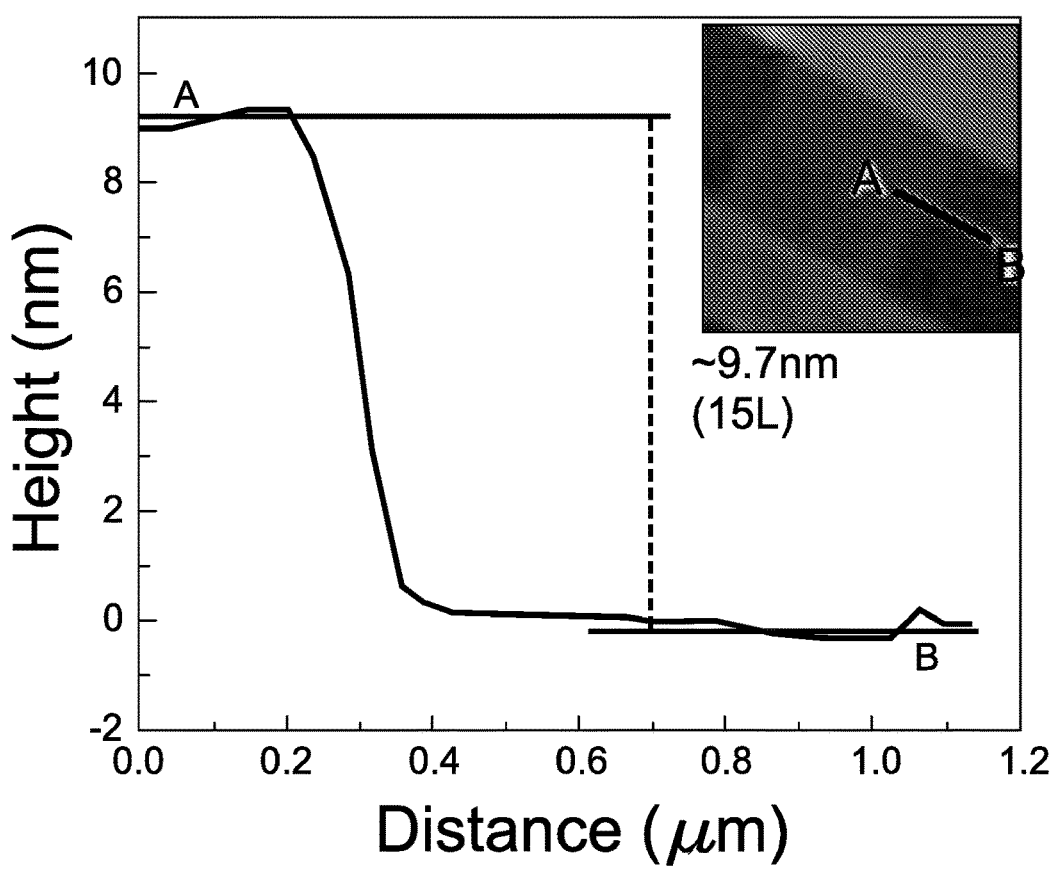
FIG. 1(b) is an atomic force microscope (AFM) image and geometrical step profile of a $MoSe_2$ flake within a representative field-effect transistor channel. The thickness of $MoSe_2$ layer is approximately 9.7 nm, corresponding to ~15 layers.
Figure 1C:
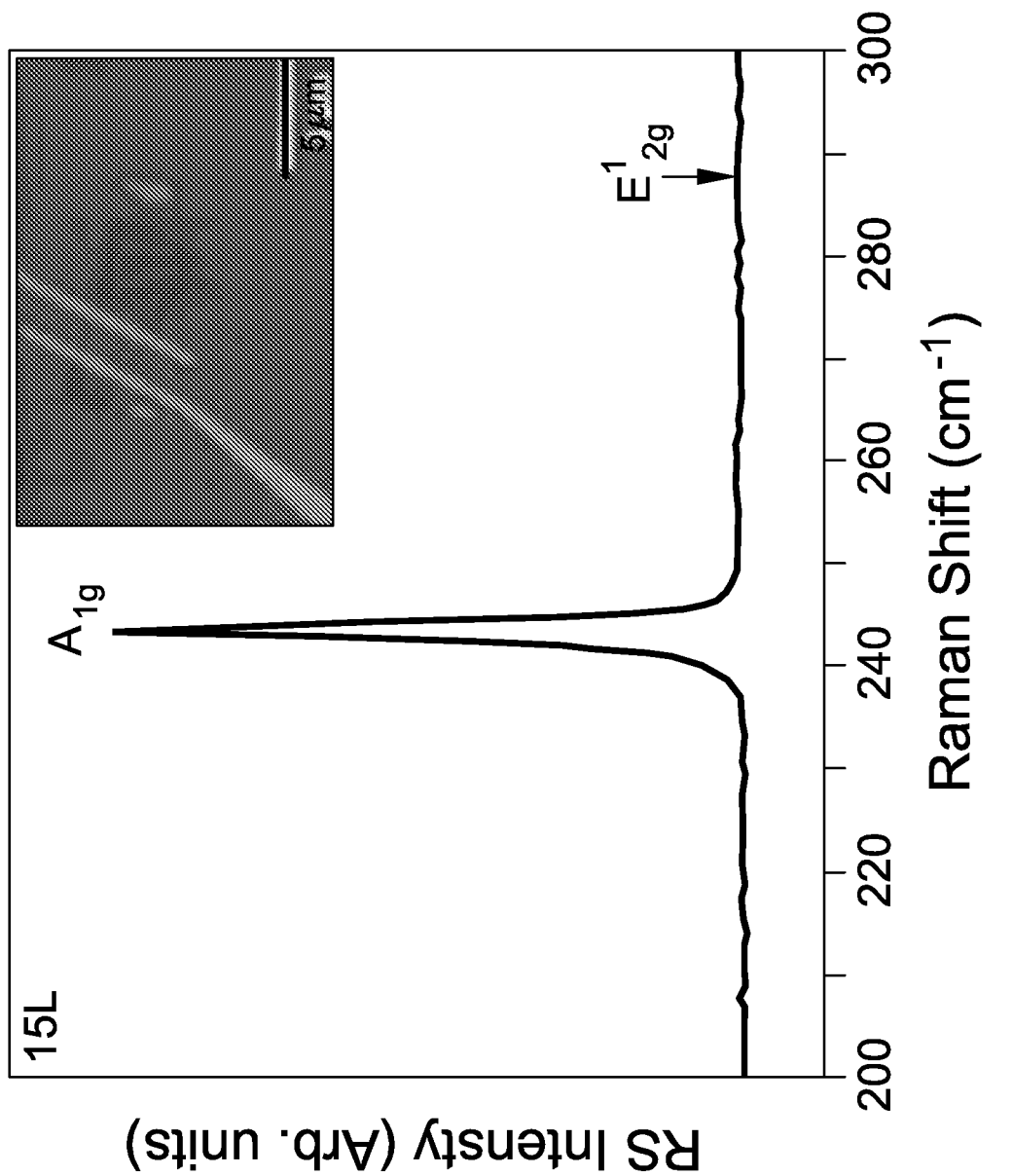
FIG. 1(c) is the corresponding Raman spectrum of $MoSe_2$ flake is shown collected using a 532-nm excitation source. The presence of two principal peaks $A_{1g}$ and $E^1_{2g}$ confirms a bonding environment corresponding to $MoSe_2$. The inset shows the optical microscope image of the device used in this study.

Turning now to FIGS. 1a-c, an embodiment of a semiconductor device 10 is shown. The device 10 comprises a channel region 12 and at least first 14, second 16, and third 18 electrodes, and a resistive layer 26.

The channel region 12 has a first surface 20 and a second opposed surface 22. The channel region 12 has a thickness of about 3 to 40 atomic layers of a compound having a transition metal and a chalcogen. In some embodiments, the thickness of the channel region 12 is about 8 to about 20 atomic layers. In preferred embodiments, the channel region 12 has a thickness of about 14 to 16 atomic layers. In some embodiments, the channel region 12 has a thickness that is less than 15 nanometers (nm), and in preferred embodiments, the channel region 12 has a thickness that is less than 10 nm. The transition metal may include molybdenum (Mo) and/or tungsten (W), and the chalcogen may include sulfur (S) and/or selenium (Se). In preferred embodiments, the compound of the channel region 12 is MoS$_2$, MoSe$_2$, WS$_2$, and/or WSe$_2$.

The first electrode 14 and the second electrode 16 overlie at least a portion of the first surface 20 of the channel region 12. The first electrode 14 and the second electrode 16 may be source and drain electrodes, respectively, and may be spaced apart so that they are separated by an area 24. In some embodiments, the first electrode 14 and the second electrode 16 comprise metals, such as Mo, chromium (Cr), gold (Au), scandium (Sc), and/or nickel (Ni). In preferred embodiments, the first and second electrode 16 comprise Sc. The first electrode 14 and the second electrode 16 may alternatively be positioned in contact with other portions of the channel region 12 without departing from the scope of the present invention.

The resistive layer 26 is in contact with the second surface 22 of the channel region 12. The resistive layer 26 comprises any resistive material, such as an oxide or nitride. In some embodiments, the resistive material comprises silicon. For example, the resistive material may include silicon dioxide, aluminum oxide, hafnium oxide, and/or boron nitride. The resistive layer 26 may be in direct contact with the second surface 22 of the channel region 12.

The third electrode 18 may be in contact with a bottom surface of the resistive layer 26 and comprise a doped silicon layer 28. The doped silicon layer 28 may comprise p-type or n-type doped Si. In preferred embodiments, the doped silicon layer 28 comprises highly doped p-type Si (p$^{++}$ Si). In alternative embodiments, the third electrode 18 and/or resistive layer 26 may overlie at least a portion of the first surface 20 between the first and second electrode 14, 16, such as in a portion of the area 24, without departing from the scope of the present invention. The third electrode 18 may comprise additional or different materials than those described above without departing from the scope of the present invention.

With the first and second electrodes 14, 16 being on an opposite side 20 of the channel region 12 as the third electrode 18, the device 10 is operable to function as a back-gated transistor. In preferred embodiments, the device 10 is operable to function as a Schottky-barrier FET. The device 10 may be configured so that when a biasing voltage is applied between the first electrode 14 and the second electrode 16 so that there is a voltage drop of about 20 mV to about 500 mV from the first electrode 14 to the second electrode 16, and a gate voltage is applied between the third electrode 18 and the second electrode 16 so that a higher voltage is at the third electrode 18 relative to the second electrode 16, an "on-current" is generated. The biasing voltage overcomes a Schottky barrier formed by the proximity of the first electrode 14 to the channel region 12. The gate voltage provides an electric field in the channel region 12 to induce a conductive path in the channel region 12 between the first and second electrodes 14, 16. The on-current may travel from the first electrode 14 to the second electrode 16.

The device 10 may be further configured so that when the biasing voltage is applied between the first electrode 14 and the second electrode 16 and no gate voltage is applied to the third electrode 18, an "off-current" is generated. The off-current is a small amount of current (relative to the on-current) that travels from the first electrode 14 to the second electrode 16. The ratio of the on-current to the off-current may be at least 75,000. In preferred embodiments, the biasing voltage may be about 150 mV to about 250 mV. The device 10 may be optimized so that it has a Hooge constant that is less than 0.01, an electron mobility (intrinsic and extrinsic) of at least 30 $cm^2/V \cdot s$ (and in preferred embodiments an electron mobility (intrinsic and extrinsic) of at least 60 $cm^2/V \cdot s$), and a contact resistance that is less than 75 $k\Omega \cdot \mu m$ (and in preferred embodiments a contact resistance that is less than 40 $k\Omega \cdot \mu m$), as discussed in further detail below. Embodiments of the device 10 may be configured to operate in alternative manners without departing from the scope of the present invention. For example, the third electrode 18 may comprise n-type doped Si, and one or more of the voltages and/or currents may be reversed.

Figure 14:
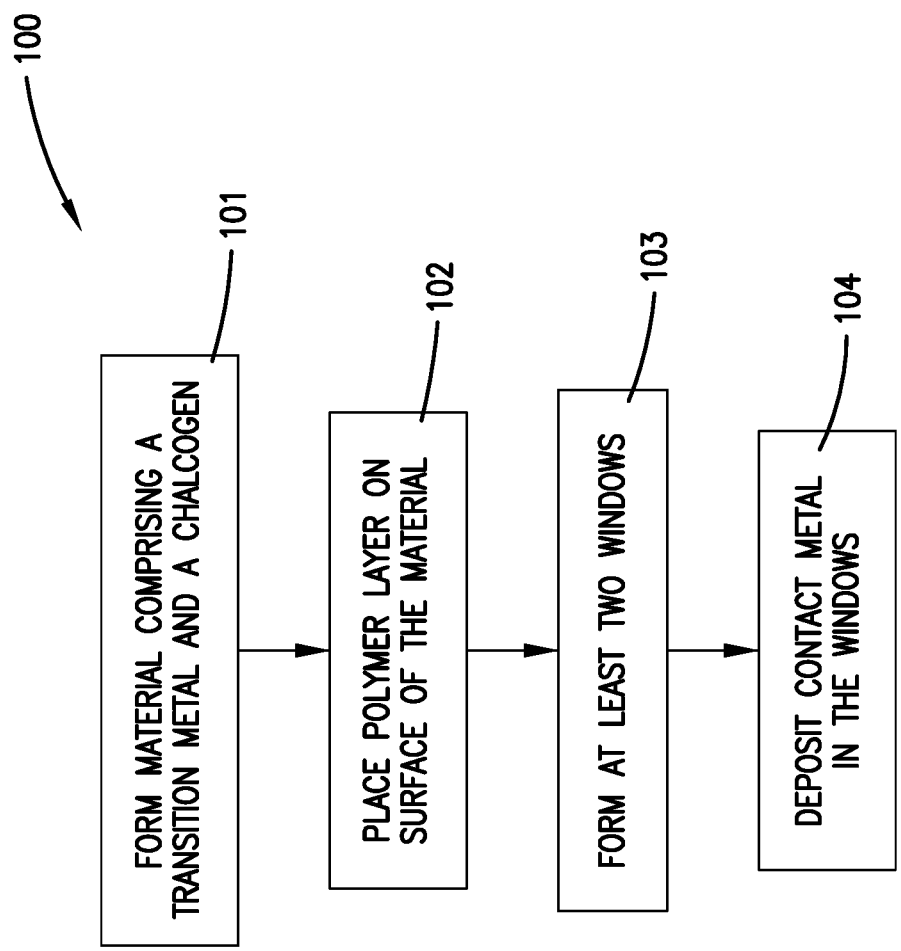
FIG. 14 is a flowchart illustrating at least a portion of the steps for forming a semiconductor device according to embodiments of the present invention.

The flow chart of FIG. 14 depicts the steps of an exemplary method 100 of forming the semiconductor device 10. In some alternative implementations, the functions noted in the various blocks may occur out of the order depicted in FIG. 14. For example, two blocks shown in succession in FIG. 14 may in fact be executed substantially concurrently, or the blocks may sometimes be executed in the reverse order depending upon the functionality involved. In addition, some steps may be optional.

Referring to step 101, a material comprising a transition metal and a chalcogen is formed. The material may have a thickness of about 3 to about 40 atomic layers. In some embodiments, the material has a thickness of about 8 to about 20 atomic layers. In preferred embodiments, the material has a thickness of about 14 to about 16 atomic layers. Alternatively or additionally, the material has a thickness that is less than 15 nm, and in preferred embodiments, the material has a thickness that is less than 10 nm. The transition metal may include Mo and/or W, and the chalcogen may include S and/or selenium Se. In preferred embodiments, the compound of the material is $MoS_2$, $MoSe_2$, $WS_2$, and/or $WSe_2$. In some embodiments, the material is formed using chemical vapor deposition, chemical exfoliation, and/or mechanical exfoliation. The material may be formed so that it has a first surface and a second opposed surface.

Referring to step 102, a polymer layer is placed on a first surface of the material. In some embodiments, the polymer layer may be placed on all surfaces of the material.

Referring to step 103, at least two windows are formed in the polymer layer by removing at least two portions of the polymer layer. In some embodiments, the two windows are formed on the first surface of the material spaced apart from one another. The at least two portions may be removed using electron beam lithography. This step 103 may include acid etching the portions of the material exposed by the windows. The etching may include buffered oxide etching and comprise applying hydrofluoric acid and/or another solvent to the material exposed by the windows. This step 103 may also include exposing the material to vacuum conditions to remove any contaminants. The preferably the vacuum conditions are about −25 inHg or lower, preferably −27 inHg or lower, and most preferably −29 inHg or lower. This makes the portions of the first surface exposed by the windows atomically clean, which reduces noise in the device, prevents oxygen from interacting with atomically small parts having electrical current, and removes any contaminant that may impede electron flow.

Referring to step 104, contact metal is deposited in the at least two windows on the first surface of the material to form at least first and second electrodes. The contact metal may comprise Mo, Cr, Au, Sc, and/or Ni. In preferred embodiments, the contact metal is Sc. In some embodiments, the depositing of the contact metal is also performed under vacuum conditions similar to those described above.

The method 100 may include additional, fewer, or alternate steps and/or device(s), including those discussed elsewhere herein. For example, the method 100 may include a step of applying a solvent, such as acetone, to the material and/or first and second electrodes after depositing the contact metal to remove excess metal particles and/or any remaining portions of the polymer layer.

The method 100 may also include adding a third electrode. In some embodiments, a resistive layer is placed in contact with the second surface of the material, and the third electrode is placed in contact with the resistive layer. The resistive layer comprises a resistive material, as discussed above. The third electrode may comprise doped silicon. The doped silicon layer may comprise p-type or n-type doped Si. In preferred embodiments, the resistive layer comprises $SiO_2$, and the doped silicon layer comprises p' Si. The resistive layer may be placed in direct contact with the second surface of the material. For example, the third electrode may be positioned on a build surface, the resistive layer formed/positioned on the third electrode, and the material may be formed/positioned on the resistive layer. Alternatively, the third electrode may be formed on a portion of the first surface of the material between the first and second electrodes without departing from the scope of the present invention. The third electrode may comprise additional or different materials than those described above without departing from the scope of the present invention.

In embodiments, the semiconductor device 10 formed by method 100 may be a transistor and preferably a Schottky-barrier FET. The device 10 may be formed via method 100 so that it has a ration of its on-current to its off-current of at least 75,000 when a biasing voltage of about 50 mV to about 500 mV and preferably about 150 mV to about 250 mV is used. Additionally, the device 10 may be formed so that it has a Hooge constant that is less than 0.01, an electron mobility (intrinsic and extrinsic) of at least 30 $cm^2/V \cdot s$ (and in preferred embodiments an electron mobility (intrinsic and extrinsic) of at least 60 $cm^2/V \cdot s$), and a contact resistance that is less than 75 kΩ·μm (and in preferred embodiments a contact resistance that is less than 40 kΩ·μm), as discussed in further detail below.

Experimental Details

MoSe$_2$ layers of various atomic thicknesses were exfoliated on Si/SiO$_2$ (90 nm) substrates using mechanical exfoliation method and their locations were identified using predefined alignment markers on the Si/SiO$_2$ substrates. Precisely, MoSe$_2$ layers with 3 L, 5 L, 8 L, 10 L, 15 L, 20 L, and 40 L were selected for FET device fabrication. The L stands for a single molecular layer of MoSe$_2$ solid. High quality bulk MoSe$_2$ crystals were used to obtain the above flakes with mechanical exfoliation. The thicknesses of the flakes were determined by atomic force microscopy and the quality of each flake was evaluated using Raman spectroscopy (with laser excitation wavelength of 532 nm). Fifty-nm-thick nickel was used as source/drain (S/D) contact electrodes in the transistor structure. The channel length of each of the devices was kept at 2 μm and the channel widths, determined by the flake dimension, were kept approximately between 2 μm and 4 μm. A semiconductor parameter analyzer, an electrical probe station, and arrangements for 1/f noise measurements were used for the transport and noise characteristics study of all the above FETs.

Specifically, MoSe$_2$ flakes were first identified using an optical microscope, and the thickness of each flake was determined using an atomic force microscope (AFM). FETs were fabricated using seven of the MoSe$_2$ flakes, with thicknesses listed in Table 1, as the channel material. Source and drain (S/D) contact electrodes were defined by e-beam lithography followed by 50 nm nickel e-beam evaporation and liftoff.

A semiconductor parameter analyzer and probe station were used for the transport measurements, and a dynamic signal analyzer, low-noise current pre-amplifier, and voltage source were used for the 1/f noise measurement. All the grounding terminals from the equipment were connected to an instrument ground system.

Figure 11A:
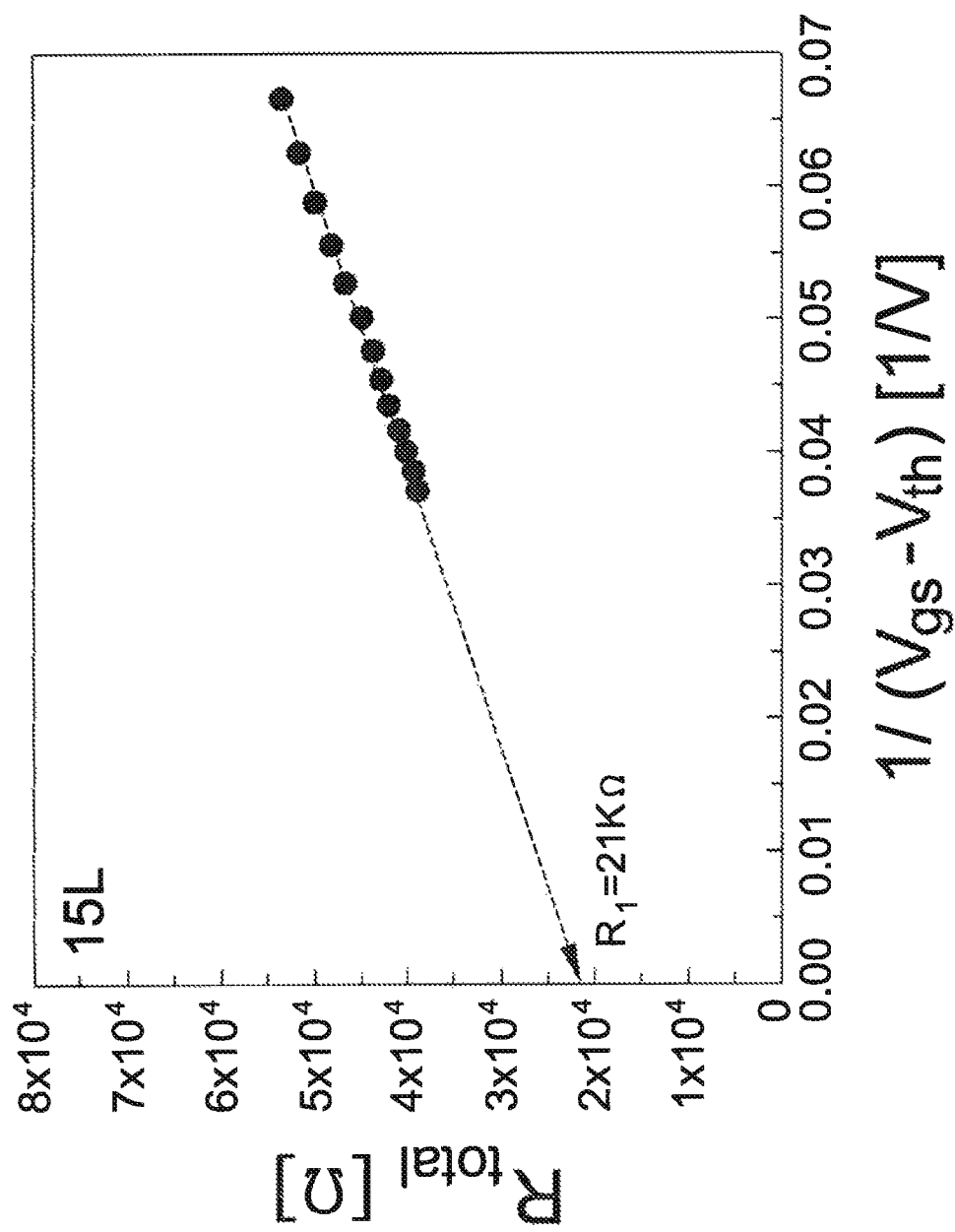
FIGS. 11(a) and (b) are charts of total resistance vs. $1/(V_{gs}-V_{th})$ for the extraction of series resistance, for a 15-layer device (a) and a 40-layer device (b).
Figure 11B:
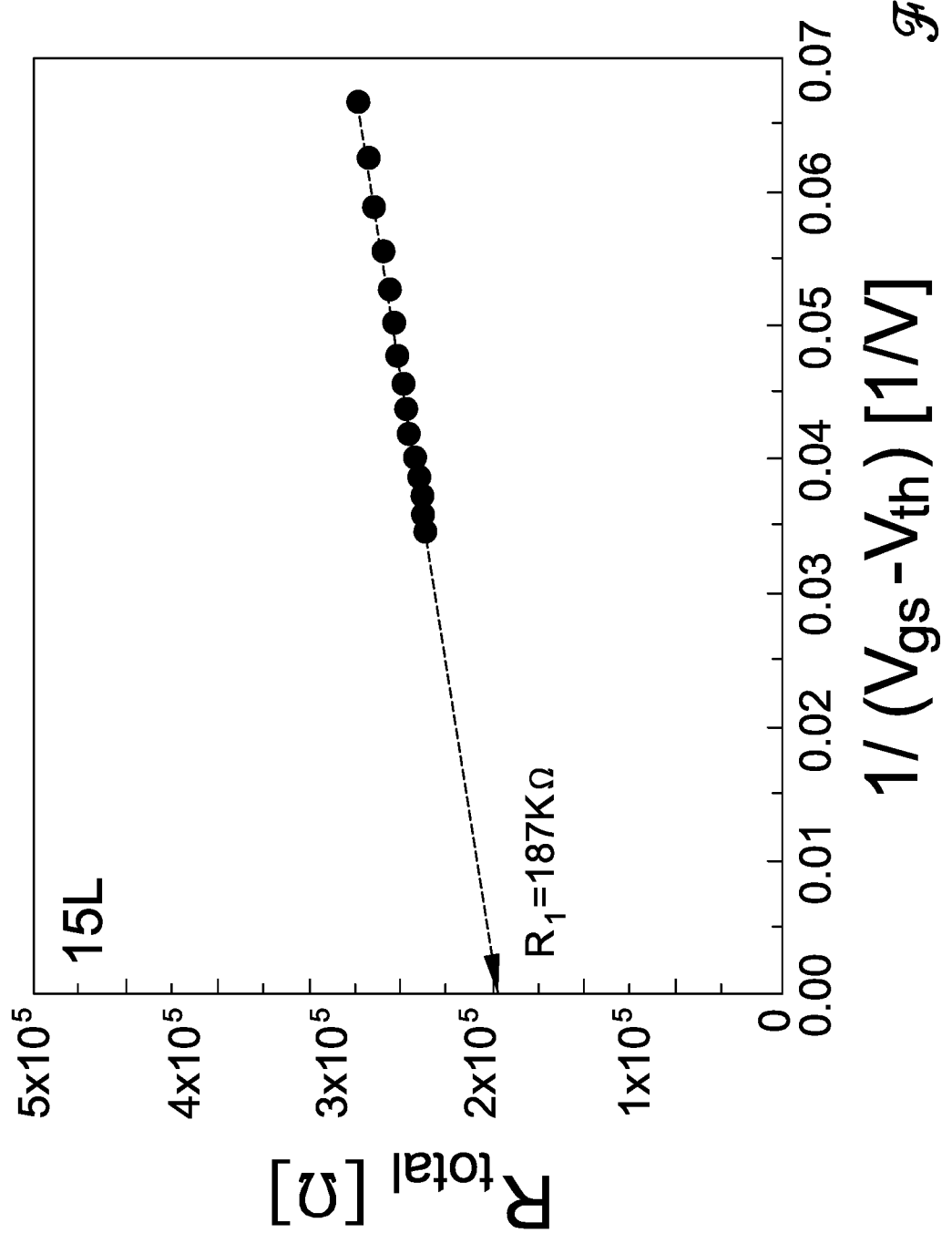

The series resistance (R$_1$) is extracted from the measured device resistance versus gate voltage relationship by plotting the total resistance (R$_{total}$) vs. 1/(V$_{gs}$−V$_{th}$) and extrapolating the line to the X-axis (FIGS. 11(a) and (b)). The extracted R$_1$ was employed for the analysis of mobility and noise parameters. For 15 L and 40 L, the series resistances were 21KΩ and 187 KΩ, respectively.

Figure 12:
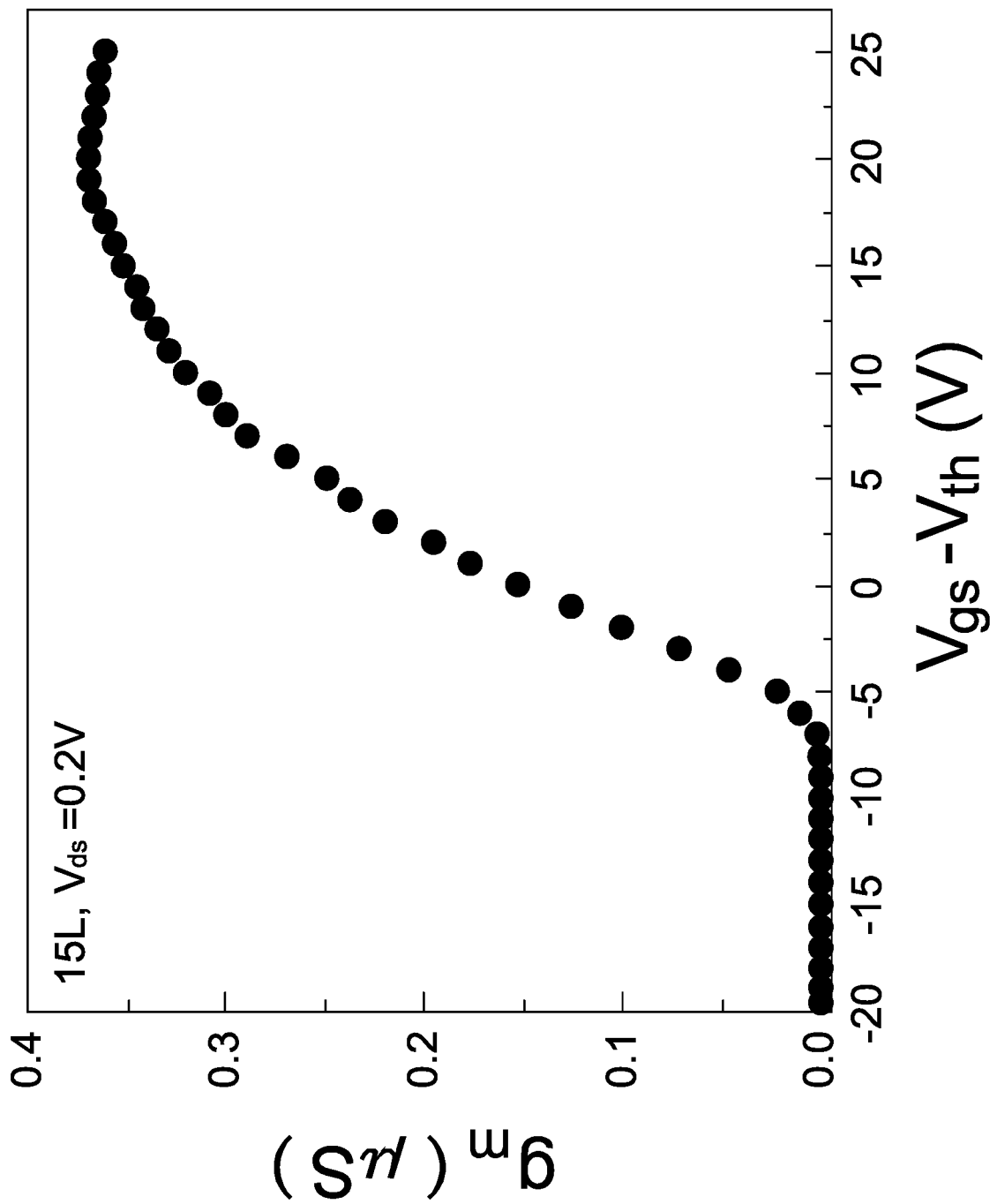
FIG. 12 is a chart of transconductance ($g_m$) as a function of the overdrive voltage ($V_{gs}-V_{th}$) at $V_{ds}$=0.2V for 15 L $MoSe_2$ FET.
Figure 13A:
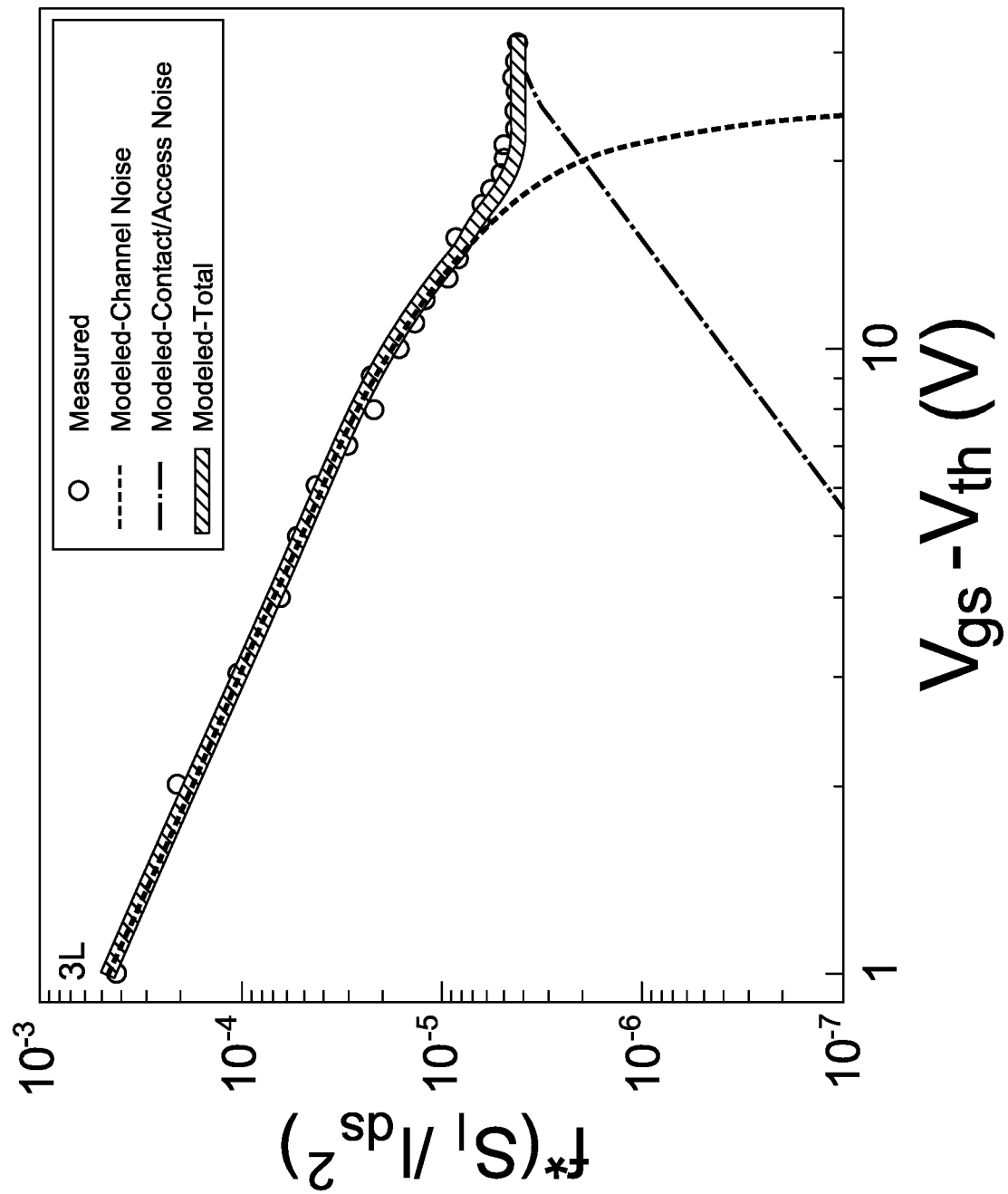
FIGS. 13(a)-(j) are charts of measured and modeled 1/f noise response and resistance noise power density and resistance of $MoSe_2$ FETs versus overdrive voltage. In particular, FIGS. 13(a), (c), (e), (g) and (i) illustrate measured and modeled 1/f noise response of $MoSe_2$ FETs versus overdrive voltage. The round symbols represent the measured data points for the normalized noise current power spectral density, $f^*S_f/I_{ds}^2$, as a function of the gate bias. The dashed lines represent the model fitting for the corresponding noise amplitude due to noise sources in the channel (blue dashed line) and the contact contribution (red dashed line). The green (solid) line shows the total modeled noise amplitude (sum of the two components).
Figure 13B:
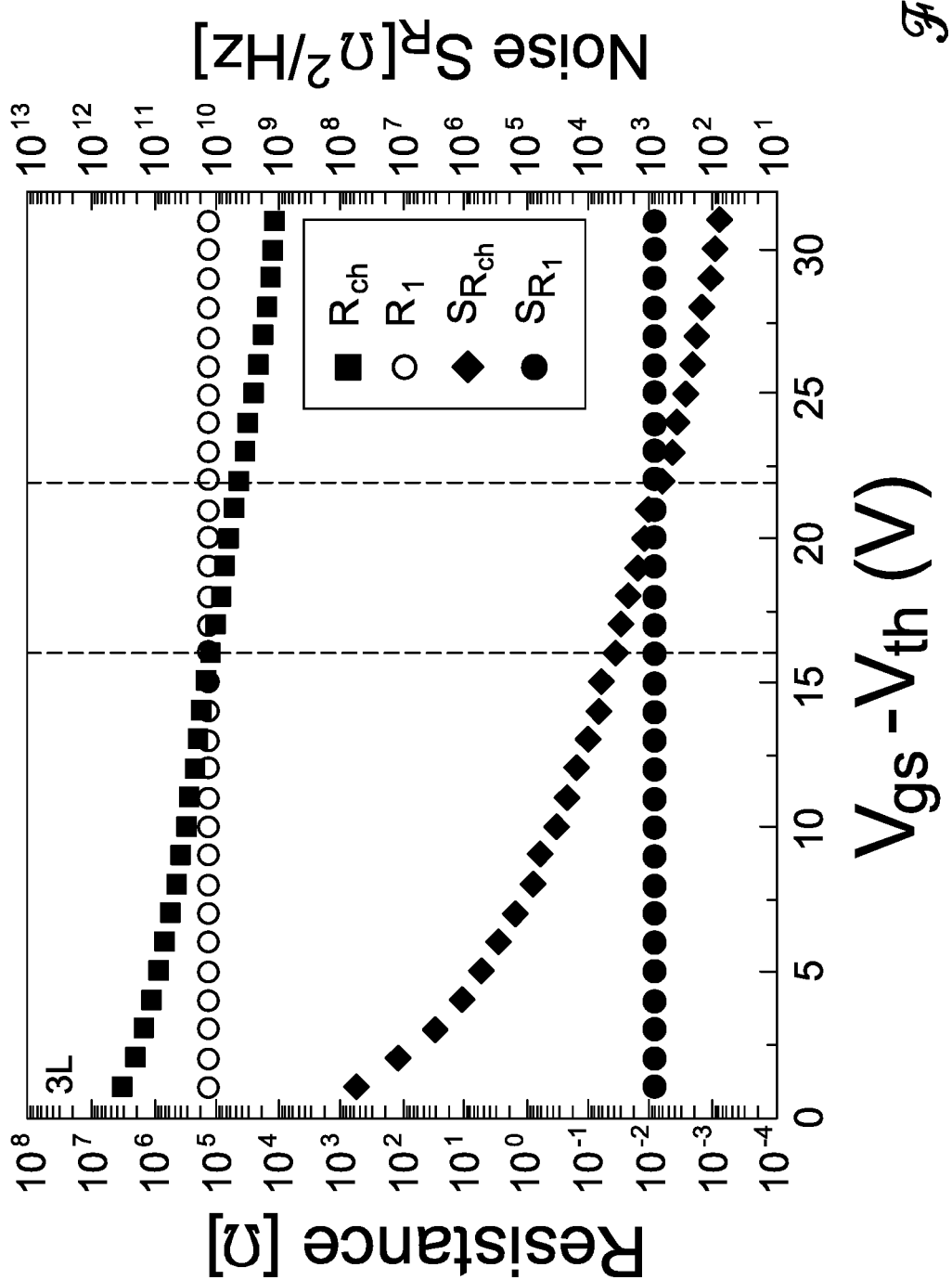
Figure 13C:
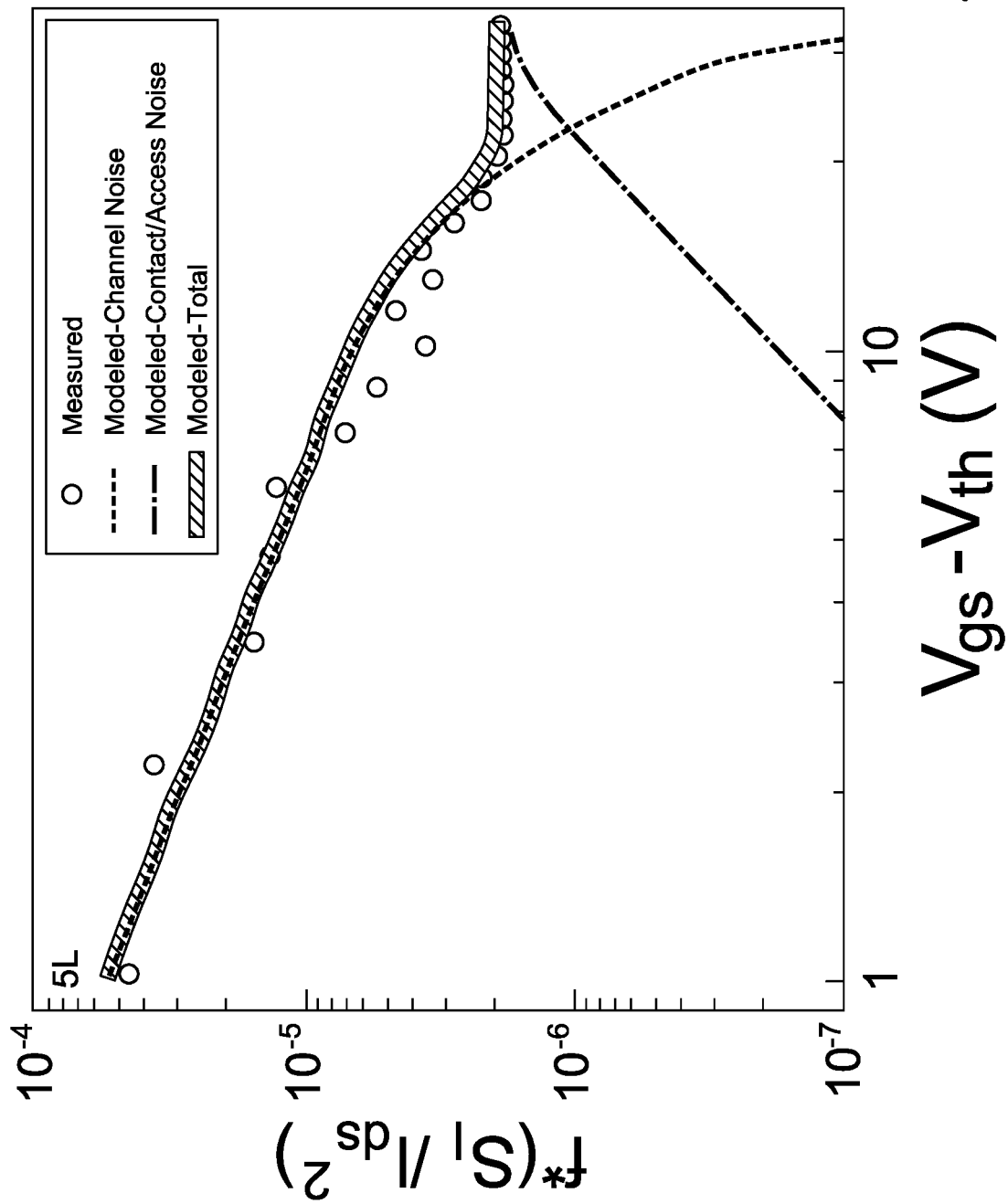
Figure 13D:
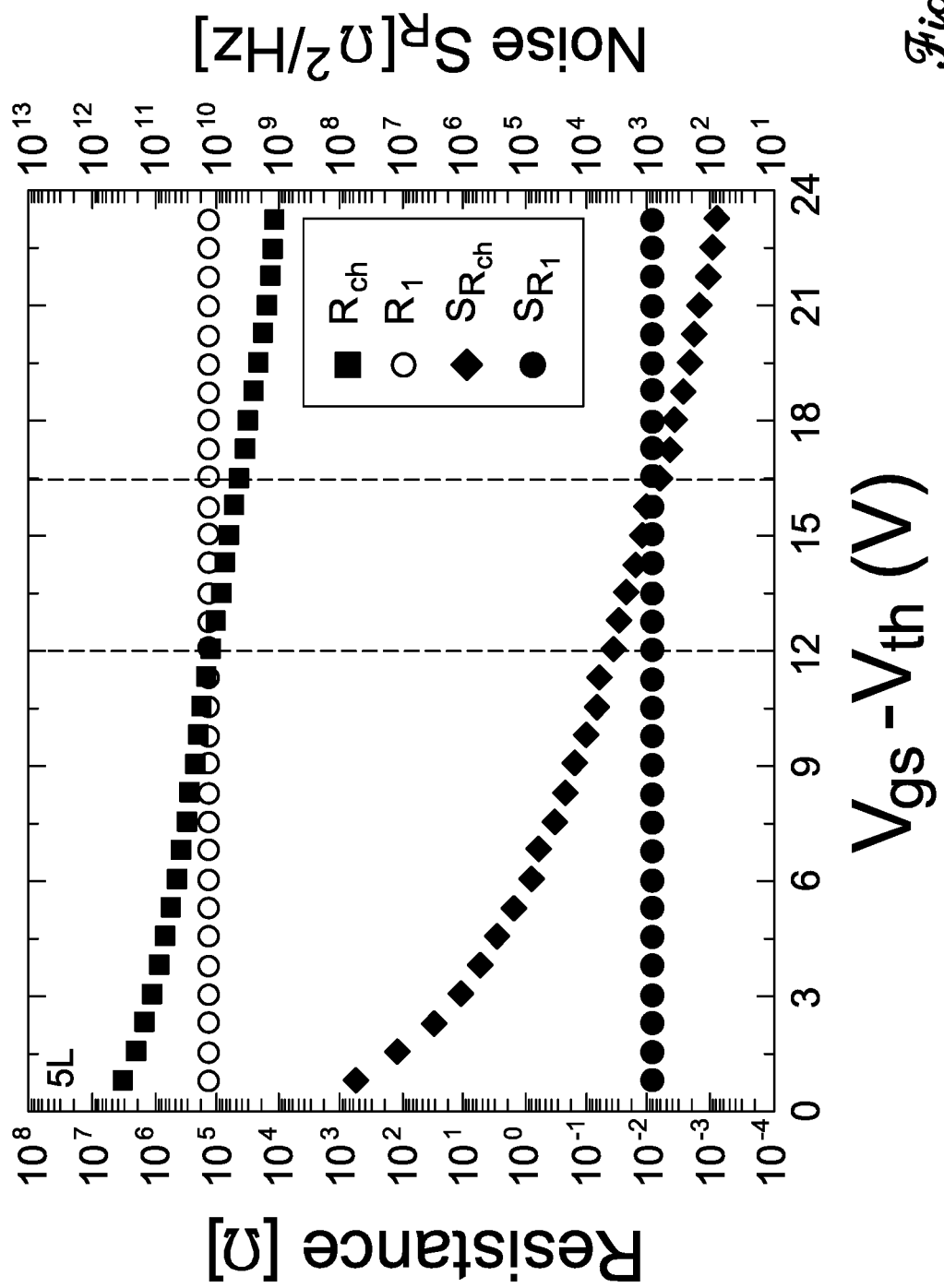
Figure 13E:
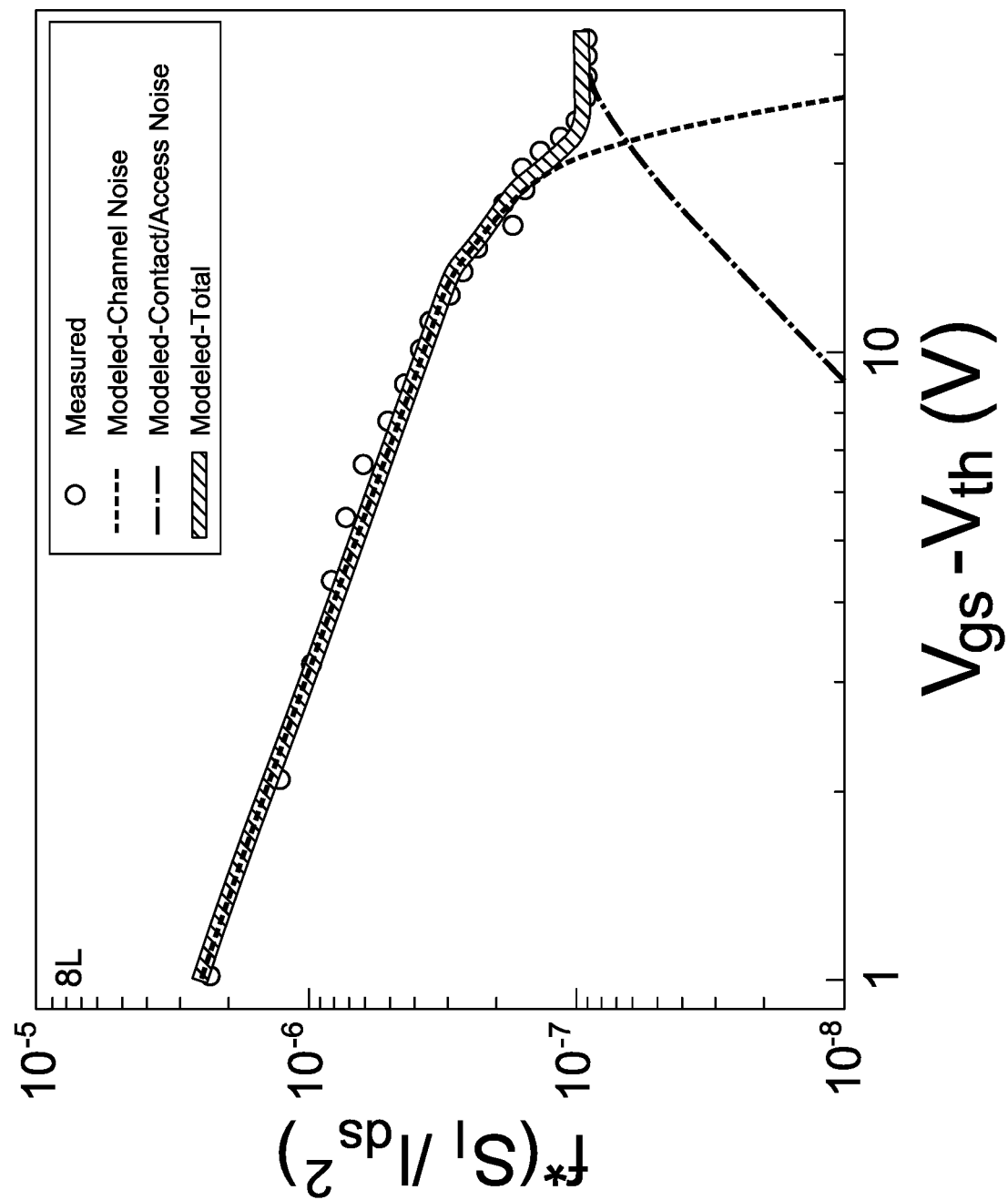
Figure 13F:
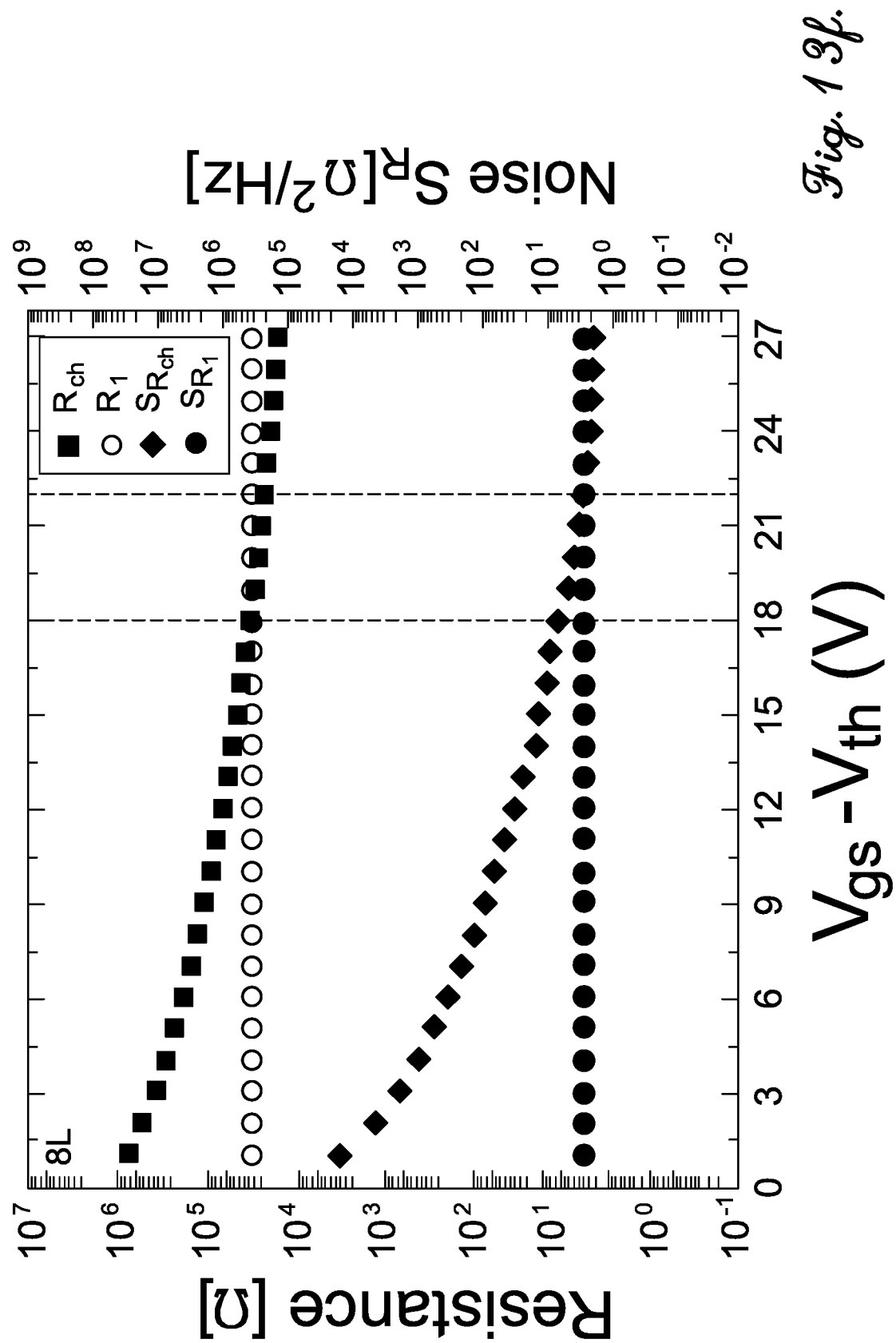
Figure 13G:
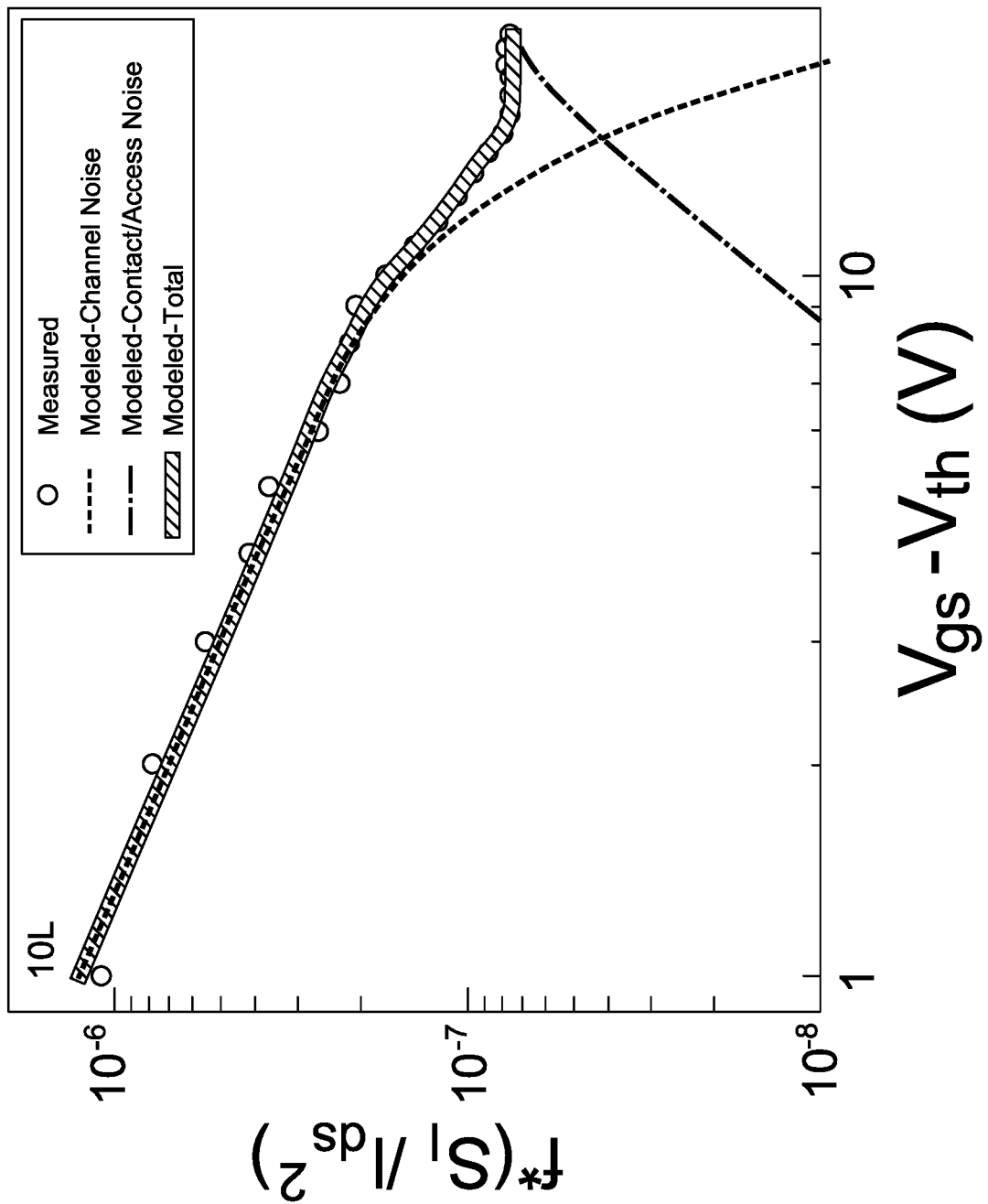
Figure 13H:
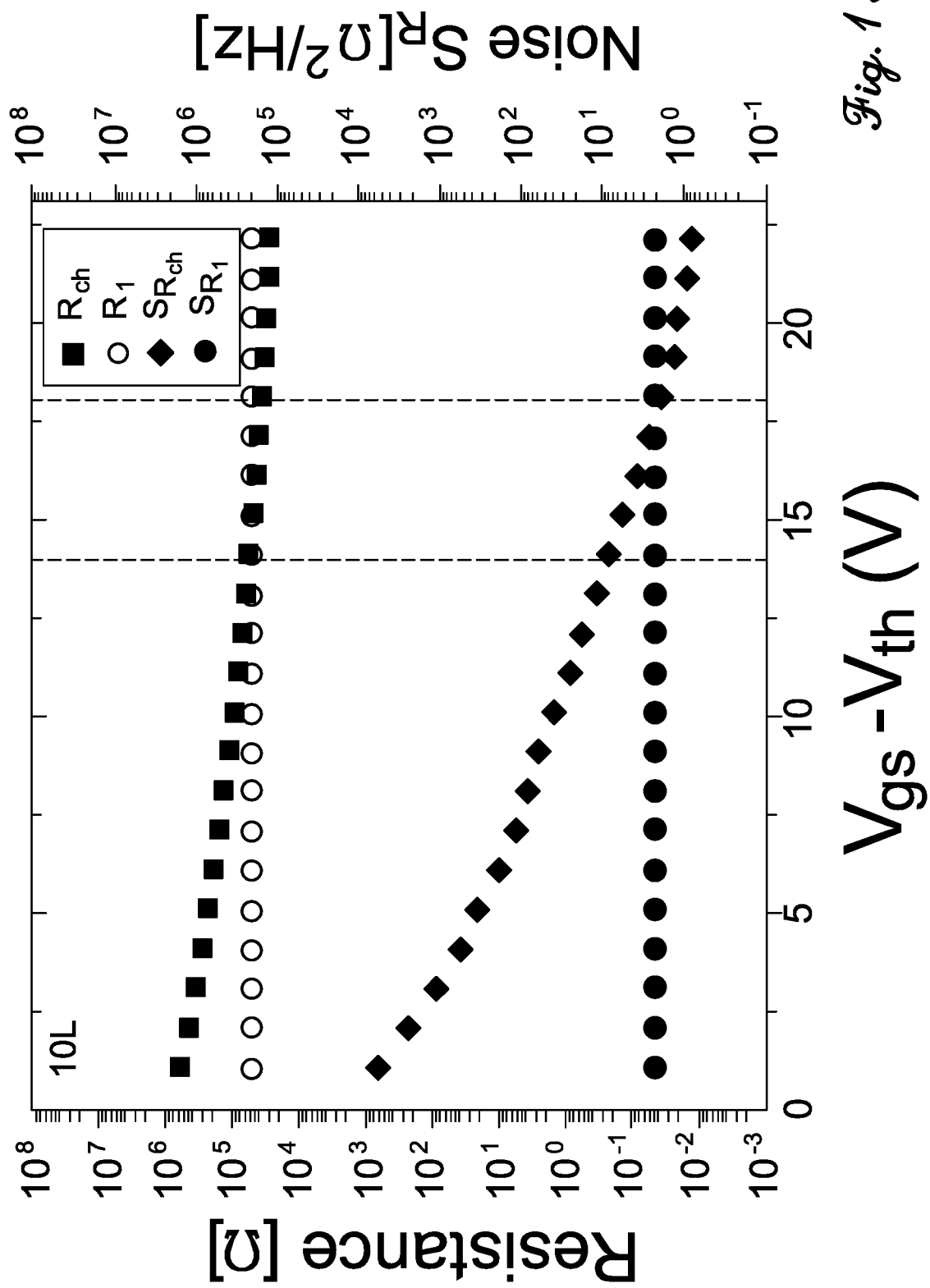
Figure 13I:
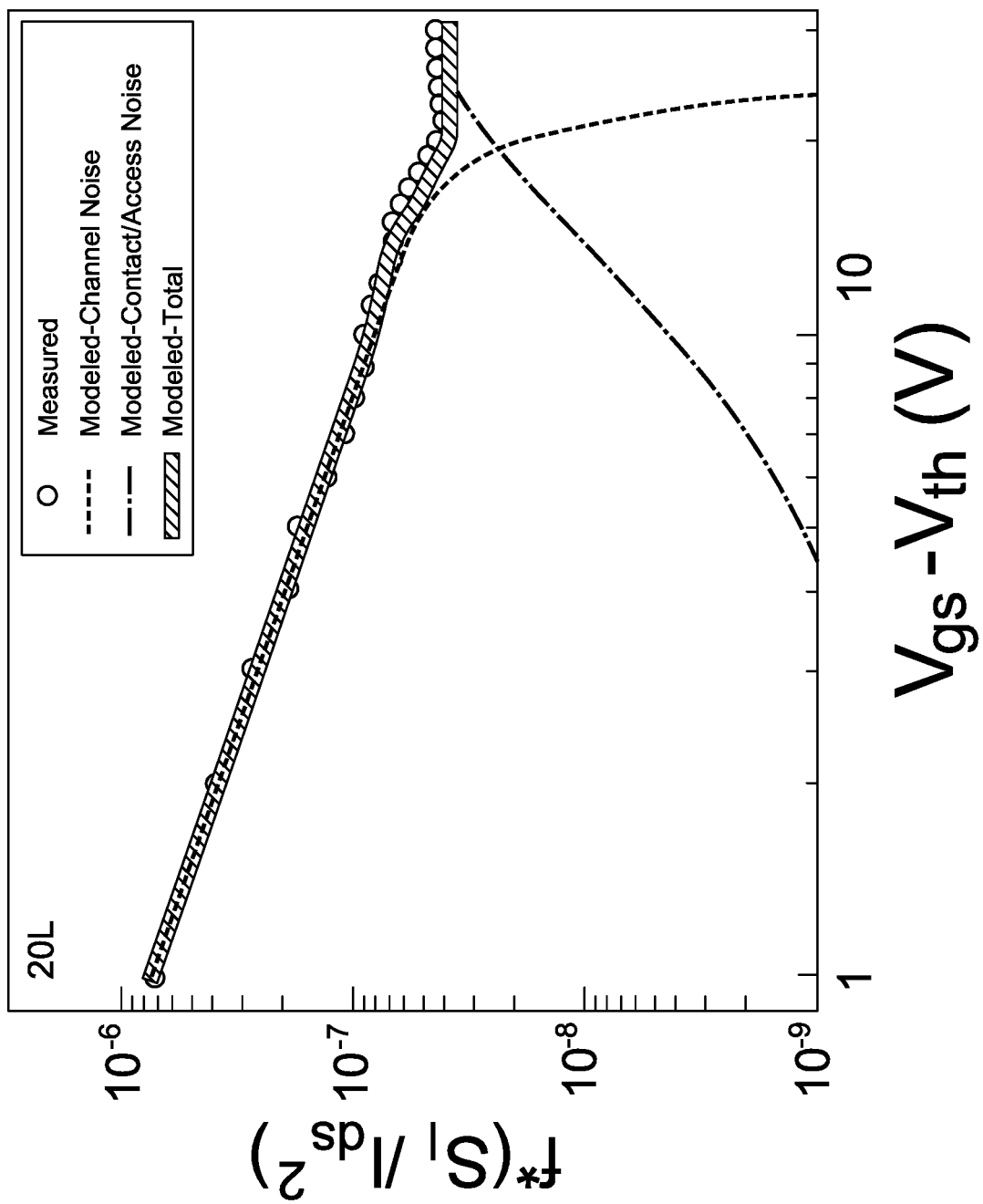
Figure 13J:
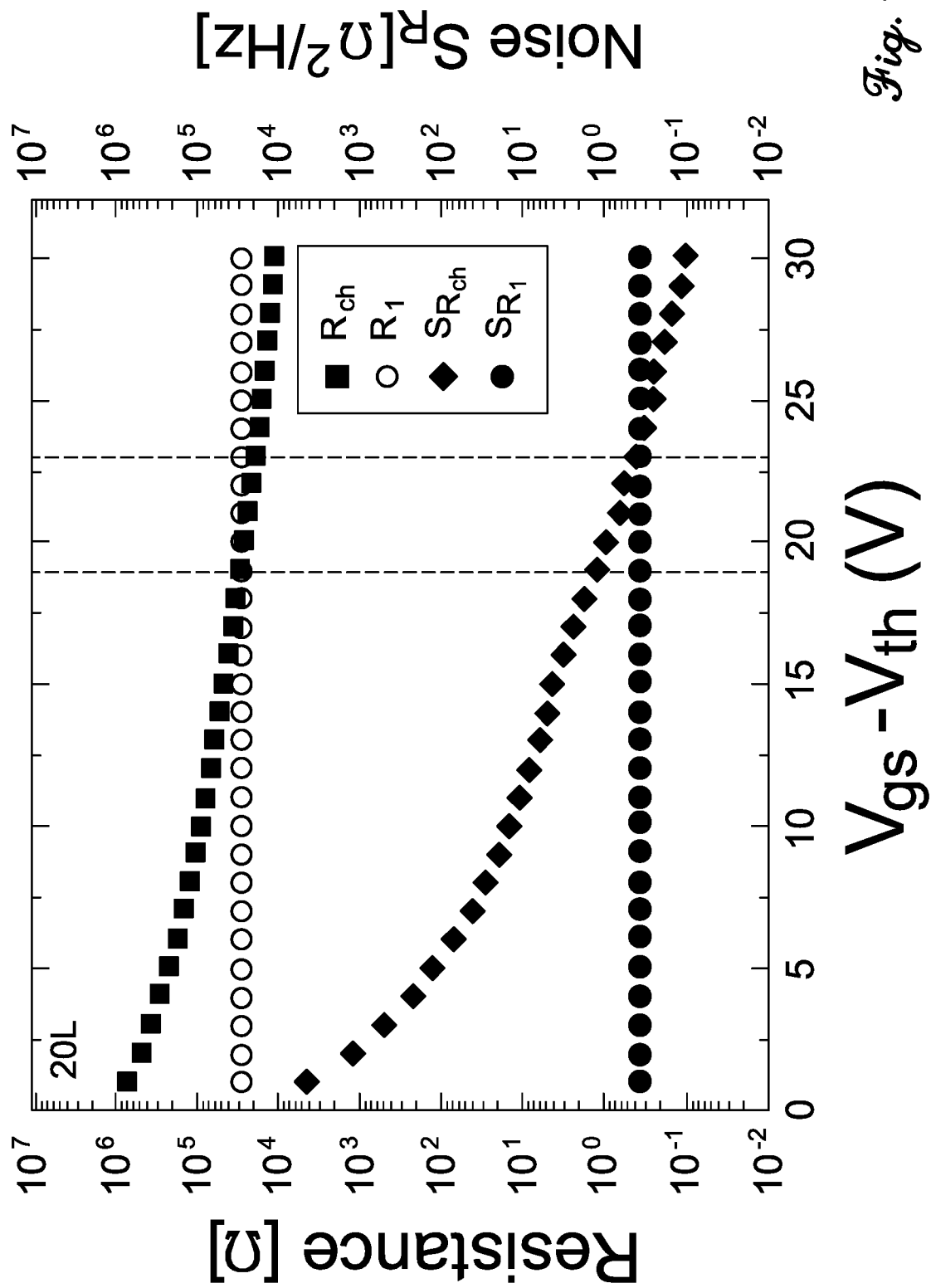

The transconductance is obtained by first order differentiation of the transfer characteristic (FIG. 12). The peak g$_m$ is then used to calculate the extrinsic field effect mobility was obtained by using the equation $$\mu_{ext} = \frac{dI_{ds}}{dV_{gs}} * \frac{L}{W} * \frac{1}{C_{ox}} * \frac{1}{V_{ds}}.$$

The measured and modeled noise amplitudes are presented in this section for FETs with various layer thicknesses (15 L and 40 L results presented in main article). For each device, the f*S$_I$/I$_{ds}^2$ is shown versus (V$_{gs}$−V$_{th}$) and the resistances and noise resistance spectral power densities associated with channel and contact/access regions are presented. See, FIGS. 13(a)-(j).

Results and Discussion

FIG. 1(a) shows the schematic view of the nickel S/D and back-gated MoSe$_2$ FET structure studied in this study. FIG. 1(b) shows the AFM image and step profile of a representative MoSe$_2$ flake that forms the channel of a FET with thickness around 9.7 nm, corresponding to ~15 molecular layers (single layer thickness of MoSe$_2$~0.65 nm). FIG. 1(c) shows the Raman spectrum of a representative flake (15 layers), acquired near its center (the laser spot size is ~1 μm in diameter and hence could be well focused at the center of the flake whose area is few square micrometers). The two primary Raman peaks, measured at positions of 243.42 cm$^{-1}$ and 286.32 cm$^{-1}$, are assigned to the A$_{1g}$ and E$^1_{2g}$ vibrational modes, corresponding to the out-of-plane and in-plane lattice vibration, respectively.

The electrical characteristics were measured in ambient conditions with electromagnetic and light shielding. Note that the devices studied in the present work are back-gated SB-FETs having a fraction of the channel itself buried underneath the S/D contacts, consequently the contribution of these portions in the carrier transport is critical for the device analysis.

Figure 2A:
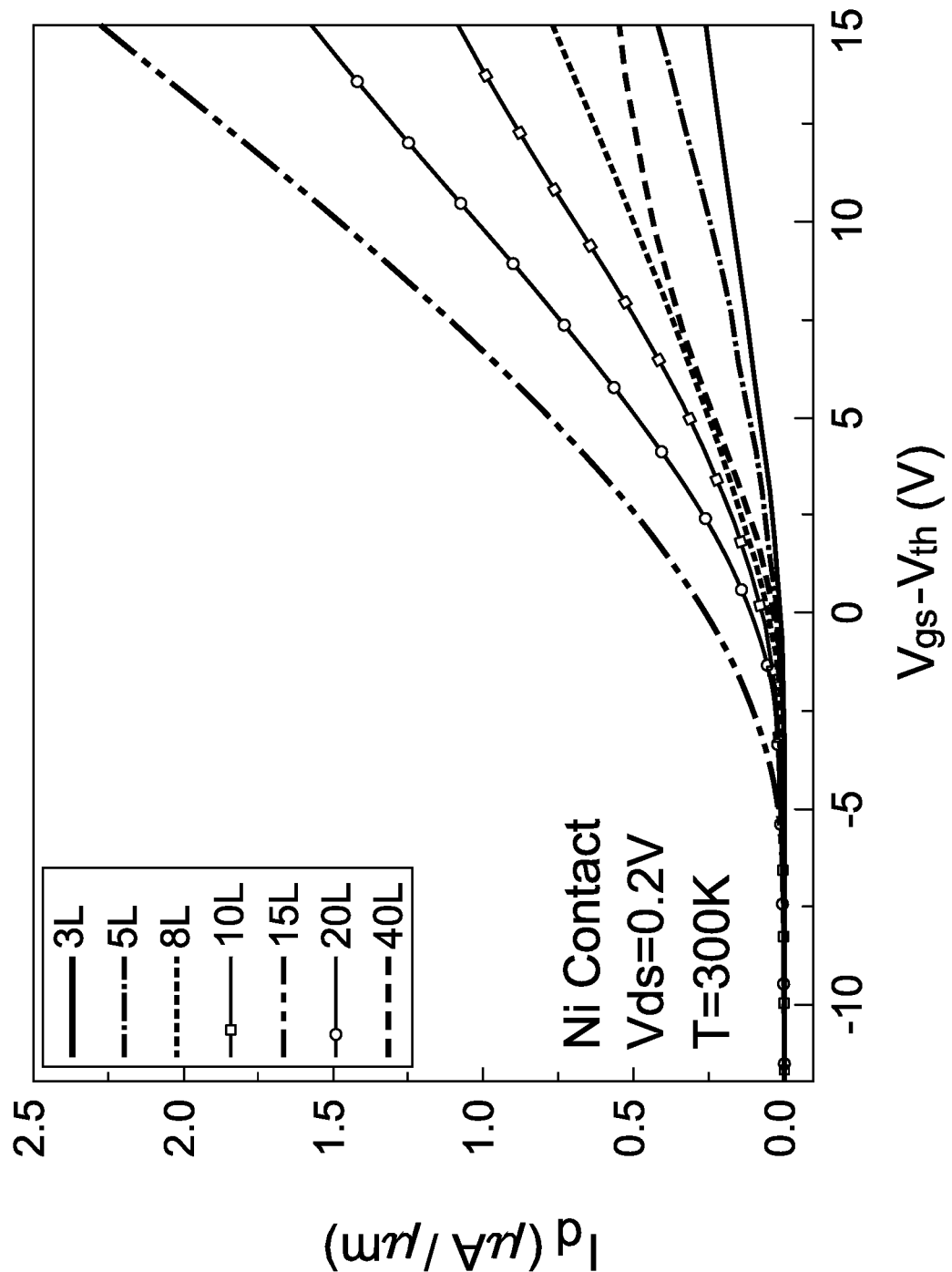
FIGS. 2(a) and (b) are charts illustrating characteristics of $MoSe_2$ FETs with different layer thicknesses (N=3, 5, 8, 10, 15, 20 and 40).

FIG. 2(a) shows the measured low field (drain-source voltage (V$_{ds}$) of 0.2V) transfer characteristics of FETs with the indicated layer thicknesses. At a given gate-source voltage (V$_{gs}$), the drain current (Id) increases with increasing layer thickness over the range of 3 L to 15 L. The 20 L and 40 L devices show a saturation with increasing V$_{gs}$, consistent with series resistance effects. A similar trend in drain current maxima has been reported in MoS$_2$ FETs with low Schottky barrier height electrodes, with a ~9 L thick channel producing the optimum current.[27] The threshold voltage (V$_{th}$) of each of the devices were obtained by extrapolating the low-field Id-V$_{gs}$ relationship to ISO.

Figure 2B:
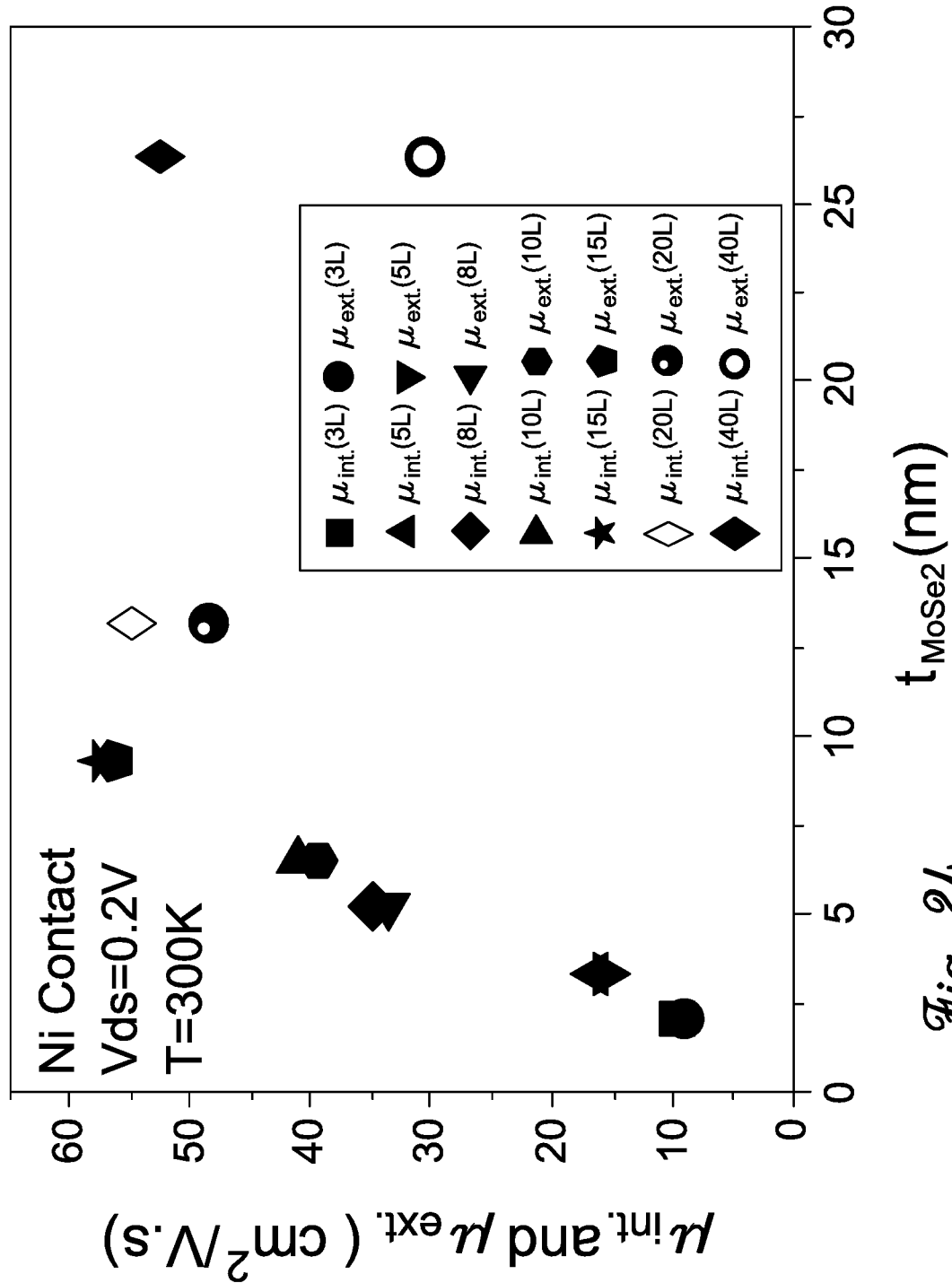
FIG. 2(b) illustrates intrinsic and extrinsic field effect mobilities extracted at $V_{ds}$=0.2V as a function of the $MoSe_2$ layer thickness. For the 8 L device, parameters are presented for the 2 μm channel length.

The transconductance (g$_m$=dI$_{ds}$/dV$_{gs}$) is dependent on V$_{gs}$; the maximum value is used to calculate the extrinsic mobility (μ$_{ext.}$) at low drain field (V$_{ds}$=0.2V), using $$\mu_{ext} = \frac{dI_{ds}}{dV_{gs}} * \frac{L}{W} * \frac{1}{C_{ox}} * \frac{1}{V_{ds}} \quad [1]$$

where L and W are the channel length and width, respectively, and Cox is the gate oxide capacitance per unit area (3.84×10$^{-4}$ F/m$^2$ for 90 nm SiO$_2$. FIG. 2(b) shows the measured μ$_{ext.}$ and the intrinsic mobility (μ$_{int}$, discussed later) as functions of MoSe$_2$ layer thickness. The rise of extrinsic field effect mobility with channel thickness (number of layers), observation of maximum value (at 15 L) and decrease beyond 15 L indicates the dominant role of the access resistances arising from S/D contacts and the inter-layer coupling beyond 15 L.

The measured I-V relationships and μ$_{ext.}$ reflect extrinsic values, i.e. they contain contributions from series resistance (R$_1$) as well as from the channel. The total extrinsic resistance, R$_{total}$, is the sum of R$_1$, which is expected to be independent of V$_{gs}$ in the ON state, and the channel resistance (R$_{ch}$), i.e.

$$R_{total} = R_1 + R_{ch} \quad [2]$$

R$_1$ is calculated from the intercept of the relationship between R$_{total}$ and the inverse of V$_{gs}$−V$_{th}$. The extracted values of R$_1$, and R$_1$ normalized by W, are shown for devices with various thicknesses in Table 1. Given the nature of the 2D van der Waal's solids, in general, R$_1$ will contain contributions from the metal-semiconductor contact resistance (R$_S$) as well as the interlayer coupling resistance (R$_{int}$) between n number of layers. In a limit in which n is significantly larger than the number of layers contributing to channel conductance, one would expect a relationship comparable to:

$$R_1 = R_s + nR_{int} \quad [3]$$

In order to quantify the channel behavior, one needs to obtain intrinsic values, i.e. without the effects of contacts/access resistances. To calculate $\mu_{int}$ the actual drain voltage across the channel ($V_{ds}'$) is calculated using $$V_{ds}' = V_{ds}(R_{total} - R_1)/R_{total} \quad [4]$$

and $$\mu_{int} = \frac{dI_{ds}}{dV_{gs}} * \frac{L}{W} * \frac{1}{C_{ox}} * \frac{1}{V_{ds}'} \quad [5]$$

where n is the number of MoSe$_2$ layers and R$_{int}$ is the interlayer resistance. As shown in FIG. 2(b), following this correction, $\mu_{int}$ remains relatively constant for layer thicknesses above 15 L (~55 cm$^2$/V·s). For layer thicknesses below 15 L, $\mu_{int}$ increases with increasing layer thickness. A number of atomic layers are required to screen such scattering effects and achieve the optimal mobility. Beyond this thickness, $\mu_{int}$ should remain relatively constant, as observed. However, R$_1$ increases with increasing layer thickness due to effects of interlayer coupling, which leads to a decreasing $\mu_{ext}$.

Figure 3A:
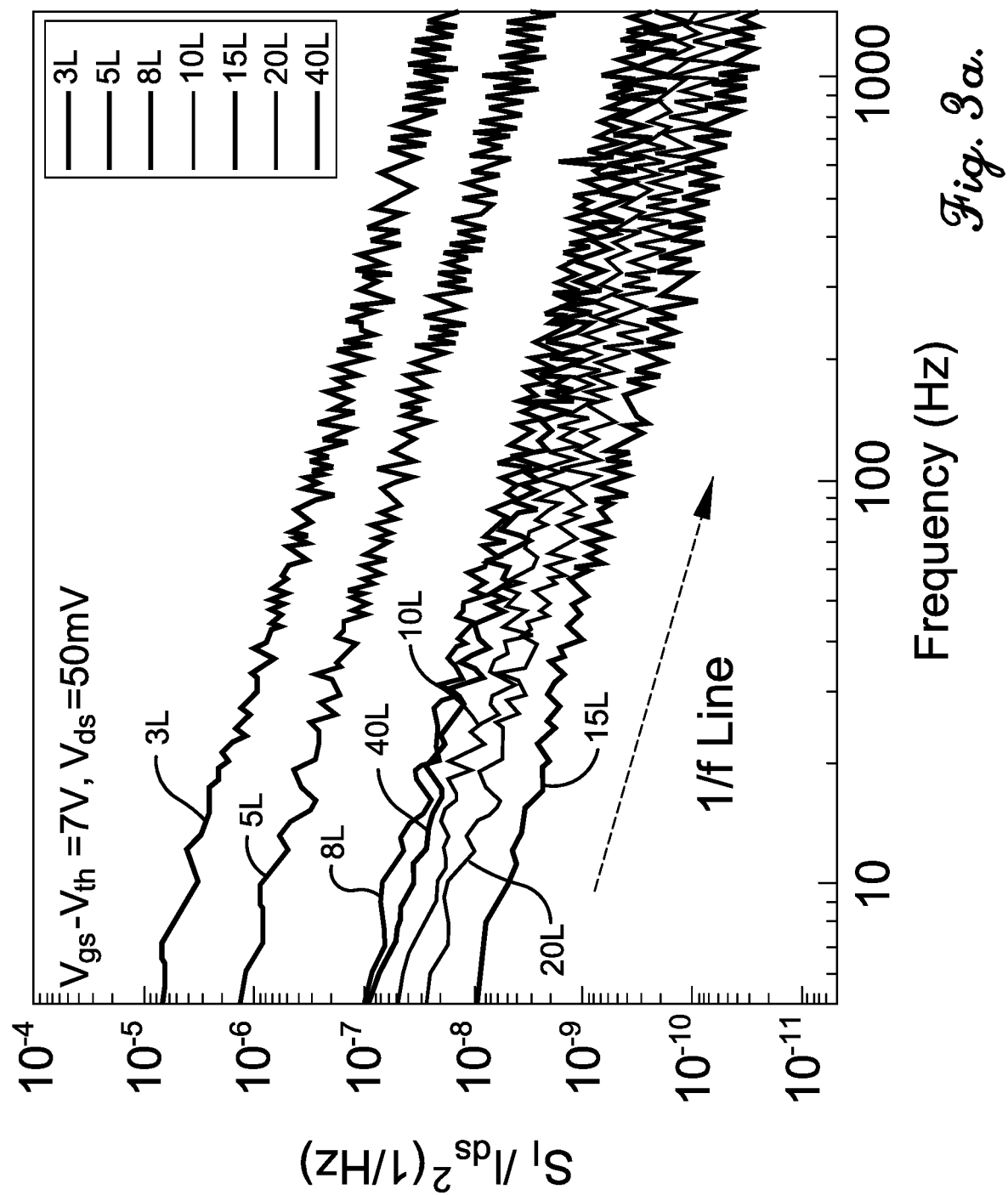
FIG. 3(a) is a chart illustrating 1/f noise current power spectral density for FETs with different number of $MoSe_2$ layers as a function of frequency for various number of layers.
Figure 3B:
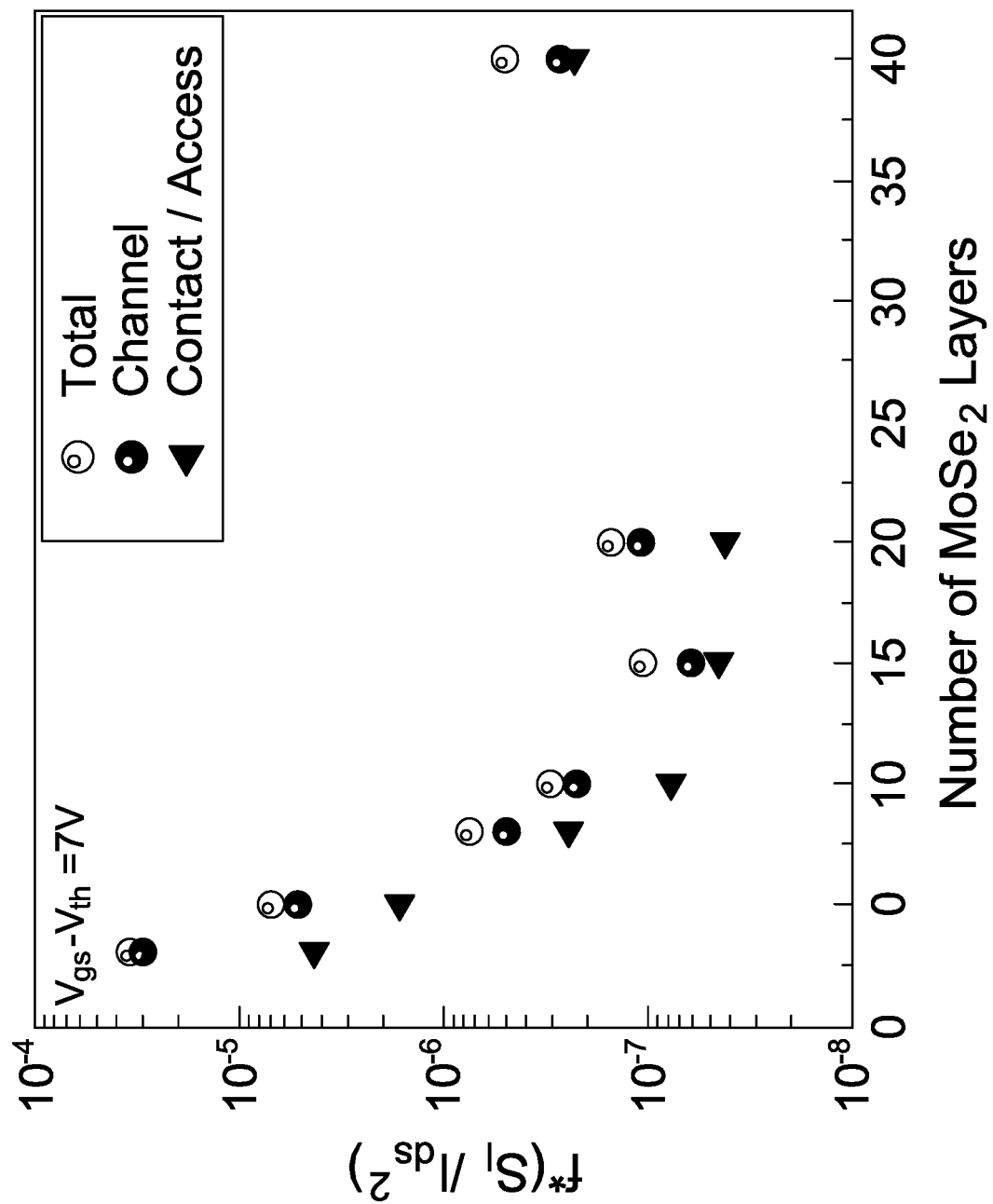
FIG. 3(b) is a comparison of normalized noise amplitudes (Total noise, Channel noise, Contact/Access noise) for FETs with different number of $MoSe_2$ layers. Noise measurements are performed at $V_{gs}-V_{th}$=7V, frequency of 100 Hz and at low drain bias ($V_{ds}$=50 mV) and channel versus contact/access contributions are extracted as described in the text.

The 1/f noise characteristics, an ubiquitous yet a key limiting factor that needs to be addressed in low-dimensional electronic devices, are of interest in terms of both the properties of the channel, e.g. channel-oxide interface, and the contributions from series resistance. Absence of such a study in 2D TMDC devices, particularly the one relating to the transport and noise in the same devices and with number of atomic layer channel thicknesses, would provide a direct correlation among these parameters insisting better and accurate design considerations of such devices for optimal performance. FIG. 3(a) shows the normalized noise current spectral density (S$_I$/I$_d^2$) vs. frequency (I) between 1 Hz and 1 kHz for MoSe$_2$ FETs with various channel thicknesses. The measurements were performed at V$_{ds}$=50 mV, to maintain operation in the linear regime) and an over-drive voltage (V$_{gs}$–V$_{th}$) of 7V for all the devices. All the FETs follow a nominal 1/f relationship (dotted line). FIG. 3(b) show the total noise amplitude (f*S$_I$/I$_d^2$), along with the channel and contact/access contributions (discussed later), at f=100 Hz vs. the number of layers. The total noise clearly demonstrates a significant decrease of 1/f noise with increasing channel thickness up to 15 L. Beyond 15 L, the total device noise increases gradually. The behavior for small number of layers is consistent with significant scattering from impurities and/or interface states. As the layer number increases to 15, the channel screens such effects. Moreover, the increase in the total device noise beyond 15 layers most likely is associated with access resistances involving the contact resistances, excess channel resistances, and interlayer coupling.

Figure 4A:
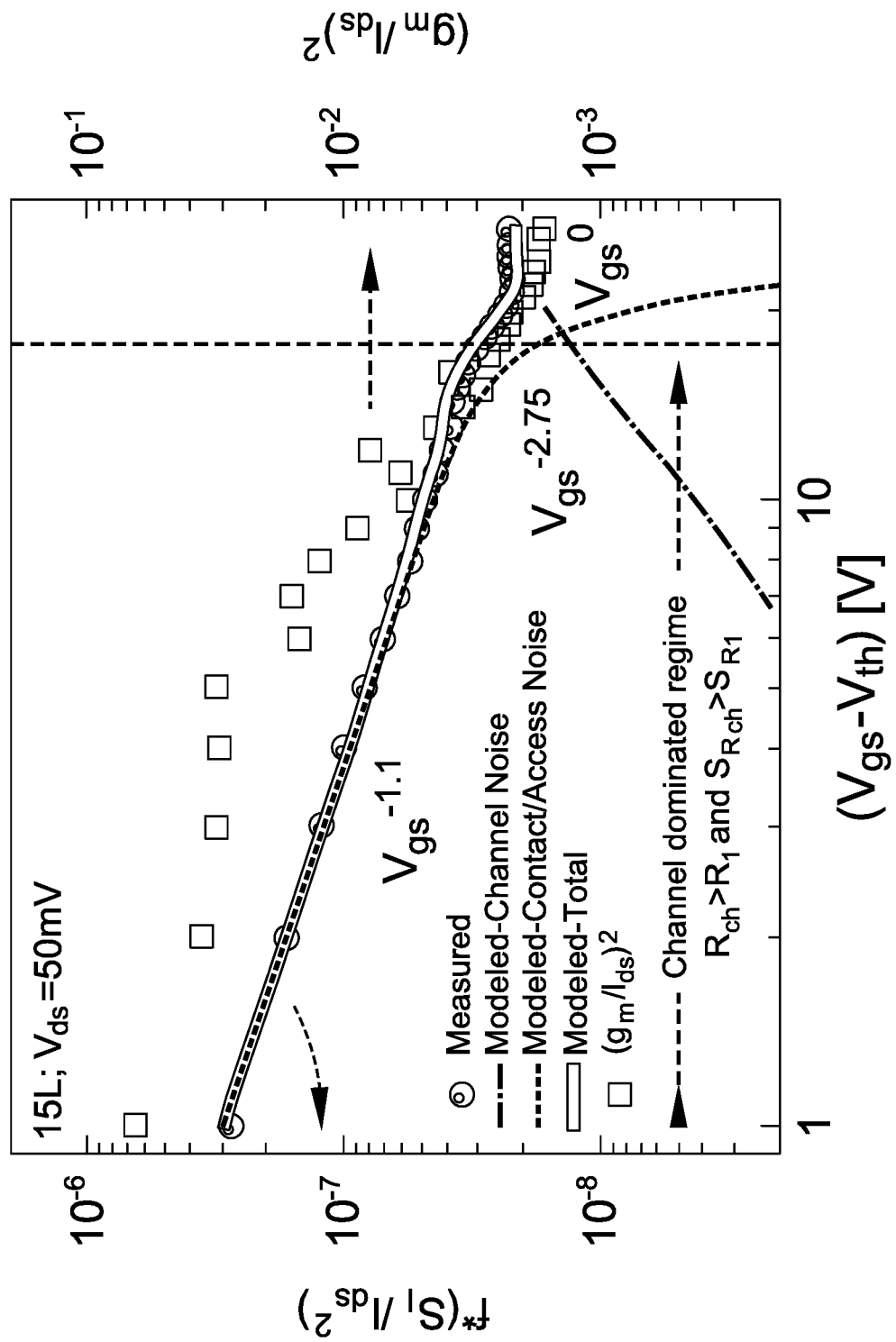
FIG. 4(a) is a chart of Measured and modeled 1/f noise response of 15 L $MoSe_2$ FET. The round symbols represent the measured data points for the normalized noise current power spectral density, $f*S_I/I_{ds}^2$, as a function of the gate bias. The dashed lines represent the model fitting for the noise dominated by the channel contribution (negative slope) and the contact contribution (positive slope), respectively. The green (solid) line shows the sum of both contributions. The opened square corresponds to $(g_m/I_{ds})^2$ in the right-sided y axis. The agreement between the modeled fitting and measured data indicates that the measured voltage dependence can be explained by a channel following Hooge's mobility fluctuation model, with a transition to contact/access dominated regime.
Figure 4B:
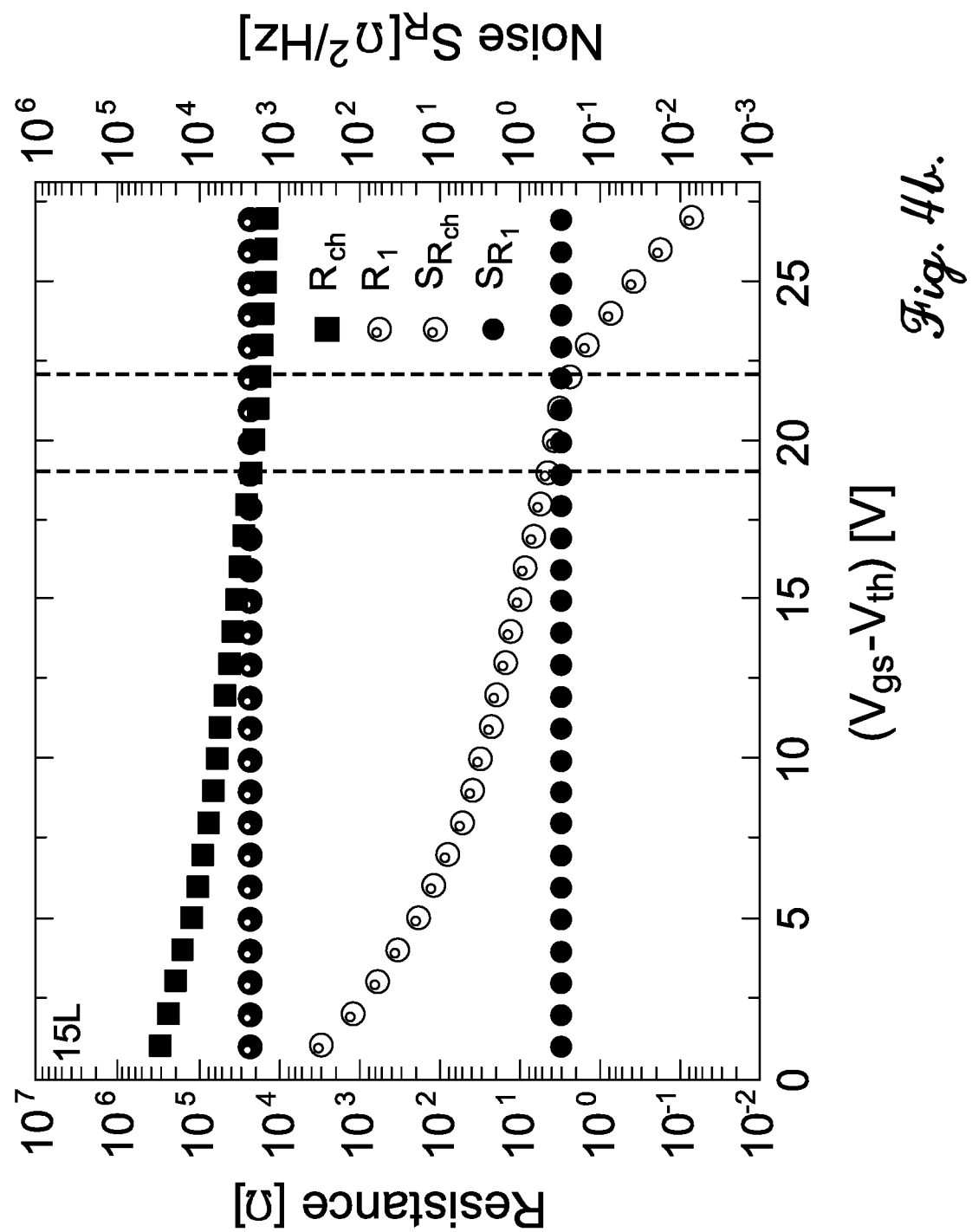
FIG. 4(b) is a chart of the contact and channel components of the noise and resistance for 15 L $MoSe_2$ FET, obtained from measurements using procedure described in the text. The shaded area represents the "transition regime" in which channel dominates noise but contact/access regions dominate resistance.
Figure 4C:
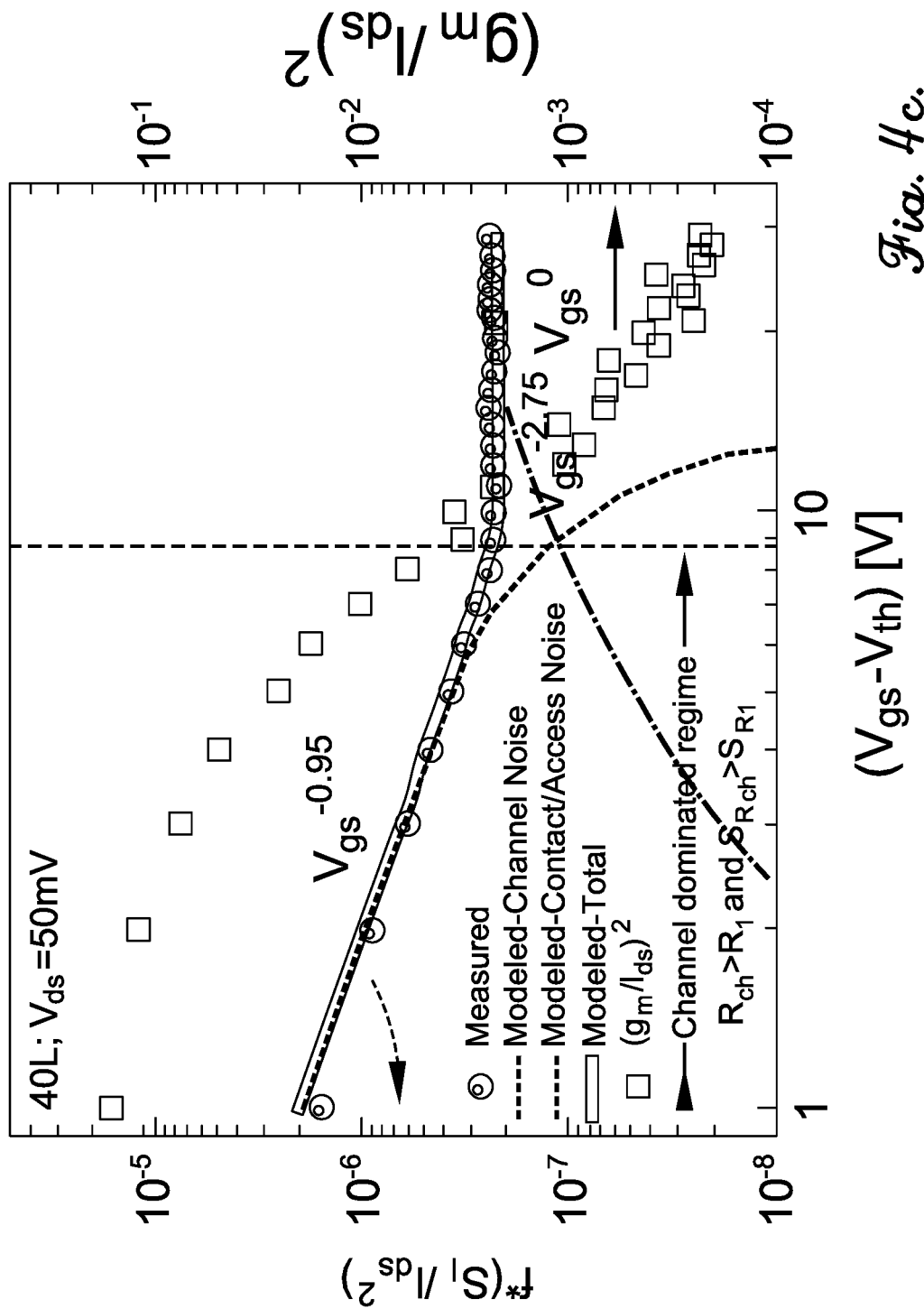
FIG. 4(c) is a chart of measured and modeled 1/f noise response and $(g_m/I_{ds})^2$ of 40 L $MoSe_2$ FET, using same symbols as (a).

FIG. 4(a) and FIG. 4(c) show the measured noise amplitude vs. (V$_{gs}$–V$_{th}$) for representative MoSe$_2$ FETs (15 L and 40 L respectively, black solid circles). In order to allow comparison to the experimental data, the corresponding model (discussed later) is also shown, with blue and red dotted lines representing terms associated with the channel and contact noise sources, respectively, and the green (solid) line representing the overall model. In order to compare the experimental data and model to that expected from a McWhorter model, (g$_m$/Id)$^2$ vs V$_{gs}$–V$_{th}$ curves are included in the same plots for 15 L and 40 L FETs. Over the voltage range considered, the (g$_m$/Id)$^2$ relationship exhibits a different gate voltage dependence than the experimental noise amplitude. For layer thicknesses above 8 L, this effect is prominent even if one restricts the voltage range to the channel-dominated regime. Similar conclusions can be reached if one considers the (V$_{gs}$–V$_{th}$)$^{-2}$ dependence associated with a McWhorter mechanism; such behavior is not observed in the experimental data. The model considered in this study, which utilizes a Hooge noise model plus contact effects, fits the data much better than a McWhorter model.

For overdrive voltages below ~10V (~9V) for 15 L (40 L), the data follows approximately an inverse relation with overdrive voltage, as expected for noise dominated by mobility fluctuation (Hooge model). At large overdrive voltages, the noise amplitude saturates, as expected in regimes in which the series resistance dominates both noise and resistance. Qualitatively similar behavior is observed for the FETs with other thicknesses in this study (See, FIGS. 13(a)-(j), showing results for 3 L, 5 L, 8 L, 10 L, and 20 L). The dependencies on both voltage and layer thickness can be explained using a model considering the effects of both the channel and the series resistance, as shown by the green curve in FIG. 4(a) and FIG. 4(c) and explained in the following section.

As with the conductance/mobility behavior, the noise behavior can be separated into contributions from the channel and from the series resistance. Following previous approaches for separating channel and contact noise contributions in transistors, it is convenient to transform into resistance spectral power density for the overall device (S$_{Rtotal}$) and to consider contributions of noise sources and resistances associated with the channel and series resistance:

$$\frac{S_I}{I_d^2} = \frac{S_{Rtotal}}{R_{total}^2} = \frac{S_{R1} + S_{Rch}}{(R_1 + R_{ch})^2} \quad [6a]$$

which can be rearranged to:

$$\frac{S_I}{I_d^2} = \frac{S_{R1}}{R_1^2} \cdot \frac{R_1^2}{(R_1 + R_{ch})^2} + \frac{S_{Rch}}{R_{ch}^2} \cdot \frac{R_{ch}^2}{(R_1 + R_{ch})^2} \quad [6b]$$

Figure 4D:
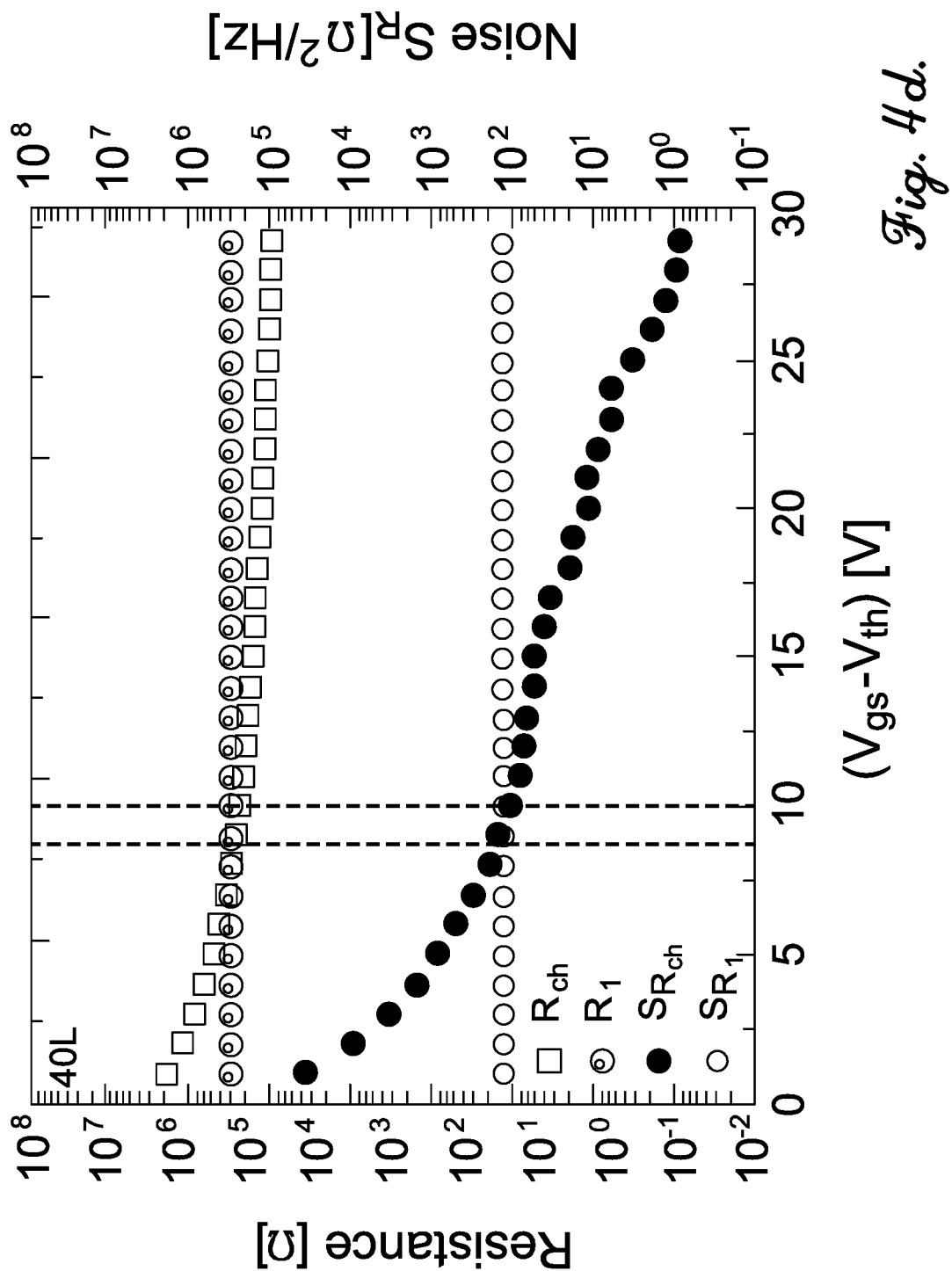
FIG. 4(d) is a chart of the contact and channel components of the noise and resistance for 40 L $MoSe_2$ FET, using same symbols as (b). In comparison to 15 L FET, the transition voltages are lower, and the width of the transition region is smaller. The noise amplitudes of the channel-dominated regime (at same bias point) and the contact/channel dominated regime are also larger, corresponding to a larger Hooge parameter and an increased noise contribution from interlayer resistances, respectively.

Here, $$\frac{S_{Rch}}{R_{ch}^2} \text{ and } \frac{S_{R1}}{R_1^2}$$

are the normalized noise resistance power spectral densities for the channel and series (contact and interlayer) resistance, respectively. For each device, the parameters on the right side of Eq. 6b are extracted at a common V$_{ds}$ (0.2V) as follows. For resistances, R$_{total}$ is determined at each V$_{gs}$ (above threshold) from the corresponding measured I$_{ds}$. R$_1$ is determined as stated earlier and assumed to be independent of V$_{gs}$. At each V$_{gs}$, R$_{ch}$(V$_{gs}$) is determined from R$_{total}$(V$_{gs}$) and R$_1$, using Eq. [2]. FIG. 4(b) shows the extracted R$_{ch}$(V$_{gs}$) and R$_1$ for the representative 15 L device, along with the corresponding noise power densities (discussed layer). A cross-over from channel-dominated (R$_{ch}$>R$_1$) to series-resistance dominated (R$_{ch}$<R$_1$) behavior is observed at approximately $V_{gs}-V_{th}=19V$. Such a transition for 40 L $MoSe_2$ FET is shown in FIG. 4(d) with the resistance cross-over point at a much lower voltage (approximately 9V).

The total noise amplitude, e.g. the data in FIG. 4(a) and FIG. 4(c), is used along with the resistances $R_{total}$, $R_1$ and $R_{ch}$, to calculate the noise sources $S_{R1}$ and $S_{Rch}$. First, the Hooge parameter is extracted using the small overdrive voltage regime, in which the measured $S_I/I_d'$ exhibits a voltage dependence of $\sim(V_{gs}-V_{th})^{-1}$ and therefore $S_{Rch} \gg S_{R1}$ is a reasonable assumption. Next, the value of $S_{Rch}$ at the maximum measured overdrive voltage is calculated using the Hooge relationship. The value of $S_{R1}$ is obtained by evaluating Eq. 6b at this voltage, i.e. using the bias-independent $R_1$ and the $R_{ch}$, $S_{Rch}$ and measured $S_I/I_d^2$ values corresponding to this voltage. Finally, $S_{Rch}$ is determined at other gate voltages using Eq. 6b, with the corresponding $R_{ch}$ and measured $S_I/I_d^2$ values. The extracted $S_{R1}$ and $S_{Rch}$ values for the representative 15 L device and 40 L device are shown in FIG. 4(b) and FIG. 4(d) respectively. Several regimes are observed. For modest $(V_{gs}-V_{th})$ values, the total noise is dominated by the $S_{Rch}$ term and follows a Hooge relationship, as evidenced by a gate voltage dependence close to $(V_{gs}-V_{th})^{-1}$. A noise crossover point $(S_{Rch}=S_{R1})$ is observed, occurring at approximately $V_{gs}-V_{th}=21.5V$ for the 15 L device. The region between the resistance cross-over point and the noise cross-over point, as indicated by shaded region in FIG. 4(b), represents a transition region in which $(R_{ch}<R_1)$ but $(S_{Rch}>S_{R1})$. Within this region, the noise amplitude is expected to follow a voltage relationship different than either the low $V_{gs}$ (channel dominated) regime or the high $V_{gs}$ (series resistance dominated) limit. For $MoSe_2$ FET with 40 L channel thickness, qualitatively similar behavior is observed (FIG. 4(d)), but with a noise crossover voltage at approximately $V_{gs}-V_{th}=10V$ and a much narrower transition region. The effect of the narrower transition region is evident in FIG. 4(c) where there is distinct variation from channel noise to contact noise without a clear intermediate $V_{gs}$ dependence.

The availability of noise and resistance parameters allows calculation of the overall voltage dependence of the noise amplitude using Eq. 6b. FIGS. 4(b) and 4(d) show the contact/access (first term in Eq. 6b) and channel (second term) contributions to the noise amplitude, along with the overall amplitude (sum of the two terms) for 15 L and 40 L devices, respectively. The overall amplitude, i.e. full right side of Eq. 6b (green line), matches well with the measured value over the entire voltage range. For overdrive voltages below ~15V, the behavior is dominated by the channel contribution and follows a $V_{gs}^{-1.1}$, consistent with a mobility fluctuation (Hooge) noise model. The channel contribution rolls off for $V_{gs}$ values above ~15V due to the resistance factor in second term of Eq. 6b; $R_{ch}$ is monotonically decreasing while $R_1$ remains constant. The collective effect of the resistance and $S_R$ transitions is a transition region in the noise amplitude, with $\sim V_{gs}^{-2.15}$ dependence for this representative device. For voltages beyond this transition region, $V_{gs}^0$ behavior is observed, as expected for a regime in which the series resistance dominates both noise and resistance. Similar channel and noise data extraction analysis was performed for all the devices, and the corresponding values are listed in Table 1.

TABLE 1

The electrical transport parameters and noise parameters of $MoSe_2$ field-effect transistors with various channel thicknesses studied in this work.

| # of Layers | $V_{th}$ | $L_{ch}$ (μm) × $W_{ch}$ (μm) | $R_1$ [KΩ] | $R_1 * W_{ch}$ [Ω*mm] | $S_{R1}$ [Ω²/Hz] | $\alpha_H$ | Voltage of Cross Point ($1^{st}$ and $2^{nd}$ terms) |
|---|---|---|---|---|---|---|---|
| 3 L | 9 V | 1.9*3 | 141 | 423 | 1014 | 7.08e−01 | 20 V |
| 5 L | 17 V | 2*1.8 | 210 | 378 | 925.5 | 2.61e−01 | 17 V |
| 8 L | 10 V | 0.5*3 | 12 | 36 | 0.33 | 9.83e−03 | 22 V |
| 8 L | 12 V | 1*3 | 20 | 60 | 0.82 | 9.24e−03 | 20 V |
| 8 L | 13 V | 2*4 | 32 | 128 | 2.09 | 9.47e−03 | 19 V |
| 10 L | 18 V | 1.9*2.1 | 54.2 | 113.8 | 5 | 5.25e−03 | 16 V |
| 15 L | 13 V | 2*1.8 | 21 | 37.8 | 0.275 | 2.64e−03 | 19 V |
| 20 L | 10 V | 2*1.9 | 30 | 57 | 0.77 | 4.58e−03 | 20 V |
| 40 L | 11 V | 1.8*2.2 | 187 | 411 | 137 | 1.54e−02 | 9 V |

Figure 6A:
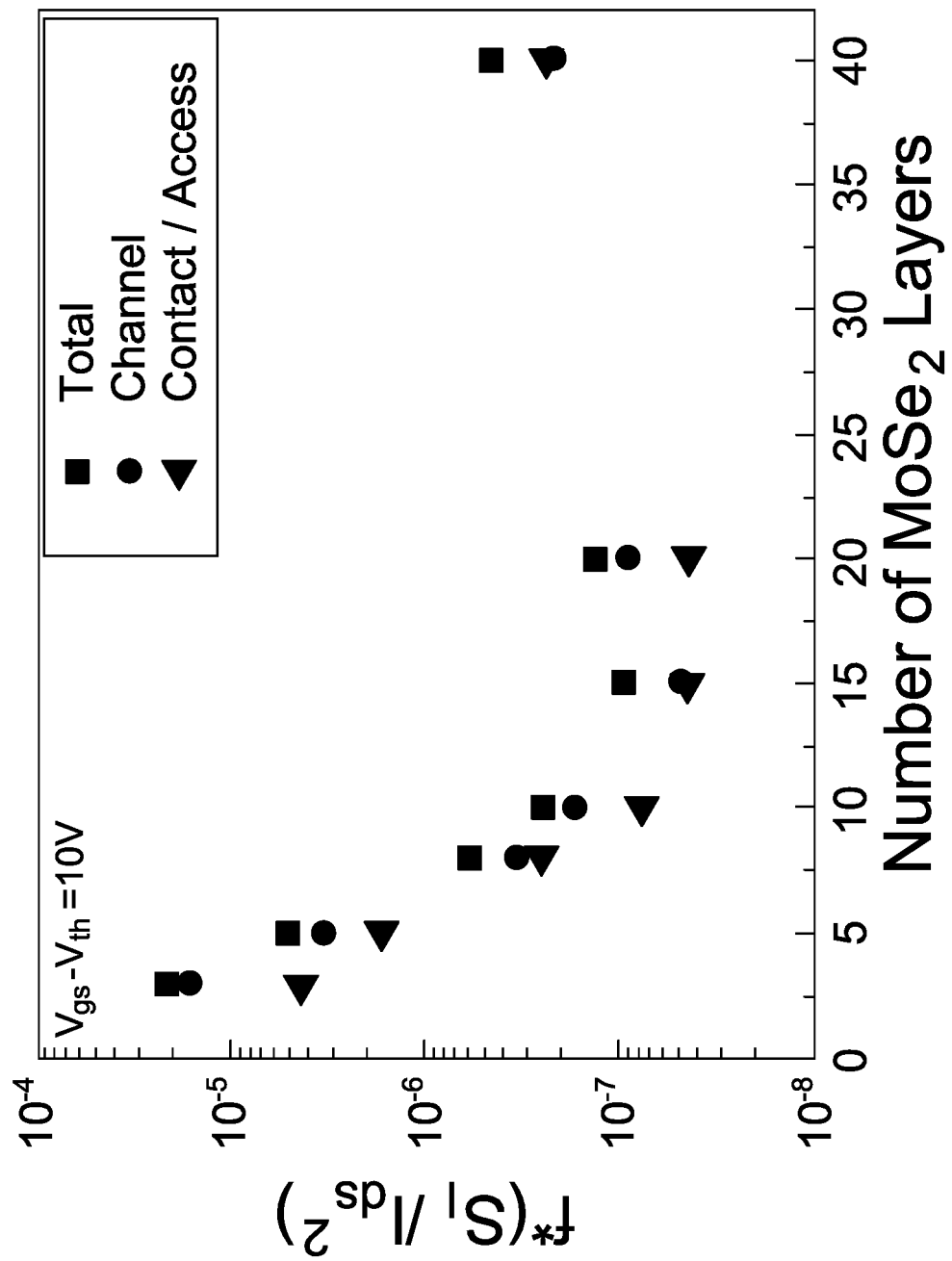
FIG. 6(a) is a comparison of the normalized noise amplitudes (Total, Channel, Contact/Access) for FETs with different number of $MoSe_2$ layers at 10V overdrive voltage. All the noise measurements are performed at $V_{gs}-V_{th}$=10V, frequency of 100 Hz and low drain bias ($V_{ds}$=50 mV).

The extracted channel, series resistance and total noise amplitudes are plotted along with the corresponding measured data in FIG. 6(a). All the devices show a clear transition from a region following the Hooge relationship to a $V_{gs}^0$ regime. However, the relationships are quantitatively different with respect to changes in transition voltages, voltage range and limiting values. In order to allow comparison of the channel and contact/access contributions to noise at a common bias point, the normalized noise amplitudes, transformed back to $S_I/I_d^2$ using Eq. 6b, are plotted for an overdrive voltage of 7V in FIG. 3(b). This overdrive voltage allows comparisons of all devices in the regime in which the channel noise term dominates, although the 40 L device is at a bias point at which the $R_1$ term starts to contribute. As observed in FIG. 3(b), the contact/access contribution is smaller than the channel term for all devices, as expected based on the choice of overdrive voltage. Qualitatively similar behavior would be expected at other bias points within the channel-dominated regime. The observation of a contact/access contribution that decreases significantly with layer thickness (3 L to 15 L) is consistent with an overall decrease in series resistance over that regime. The increase in this noise contribution at larger layer thicknesses is qualitatively consistent with expected dependence of adding noise sources corresponding to interlayer coupling resistances, both in terms of the observed increase in $R_1$ and the additional noise power spectral density ($S_{R1}$). However, as evidenced by the dependence of $R_1$ values versus layer thickness, which does not follow the simple model described in Eq. 3, attributing specific contributions to metallurgical contact versus interlayer resistance effects is somewhat difficult.

Prior studies on FETs with TMDC channels have observed comparable behavior in the transition regions between channel-dominated and contact/access dominated noise regimes. In some cases, the transition has been interpreted as a change in the dominant channel noise mechanism from a mobility-fluctuation (Hooge) mechanism to a carrier-density fluctuation (McWhorter) mechanism, which would exhibit a $V_{gs}^{-2}$ dependence. However, the voltage-dependence of the noise amplitude can be modeled using the channel and contact/access contributions discussed above, with a single physical model for the channel contribution. The voltage dependence in the transition region can be explained by the sequential transitions of resistance and noise from channel-dominated to contact-dominated regimes. Such a model is found to be valid across the full range of layer thicknesses considered in this study, with the same channel noise mechanism in all devices.

The observation of a clear channel-dominated regime, which follows the Hooge relationship, $$\frac{S_I}{I_d^2} = \frac{\alpha_H}{f \cdot N} \quad [7]$$

where $S_I$ is the current noise power spectral density, $I_d$ is the drain current in the channel, f is the frequency, and $$N = \frac{C_{ox}}{q} * (V_{gs} - V_{th}) * LW$$

is the total number of charge carriers in the channel, allows quantitative comparison of channel noise properties through the $\alpha_H$ values. In this regard, a rearrangement of Eq. 7 in the channel-dominated regime gives $$f * \frac{S_I}{I_d^2} = f * \frac{S_{Rch}}{R_{ch}^2} = \frac{q * \alpha_H}{C_{ox} * LW} * \frac{1}{(V_{gs} - V_{th})}. \quad [8]$$

Figure 6B:
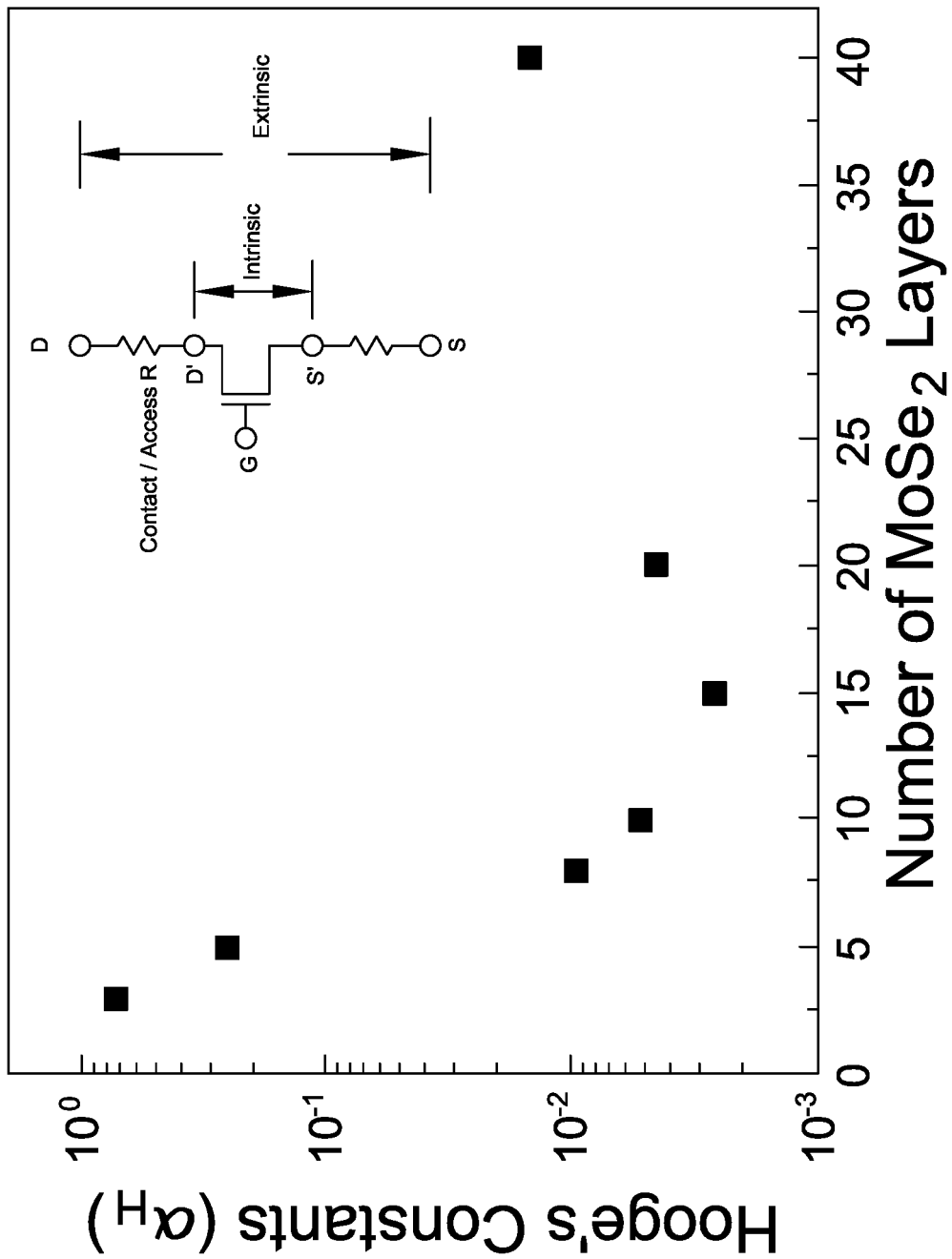
FIG. 6(b) is a chart of Hooge's constants ($\alpha_H$) as a function of number of layers in $MoSe_2$ FETs. The inset shows schematic representation of the intrinsic and extrinsic FETs.
Figure 6C:
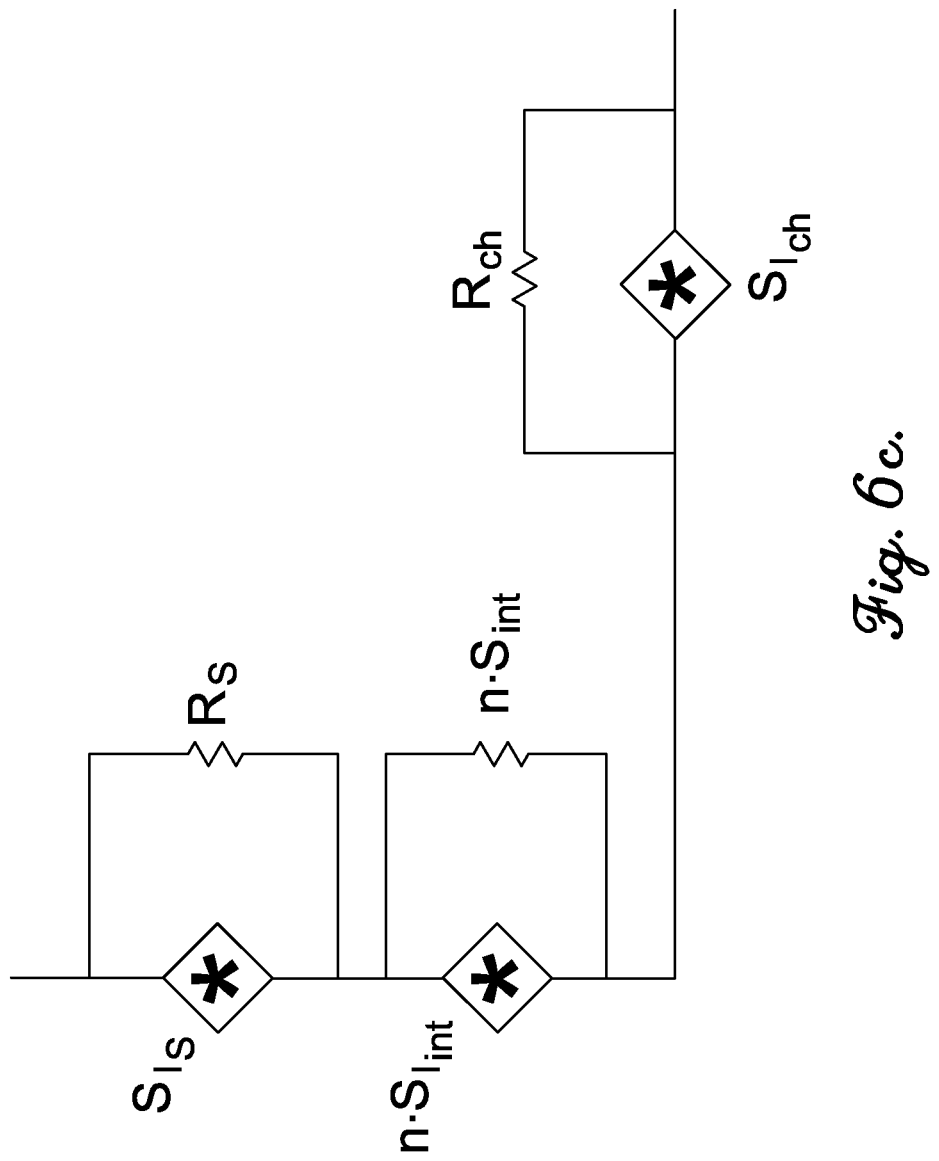
FIG. 6(c) is a schematic representation of total noise originating from three independent current noise sources, namely, contact resistance, interlayer coupling resistance, and the channel resistance.
Figure 6D:
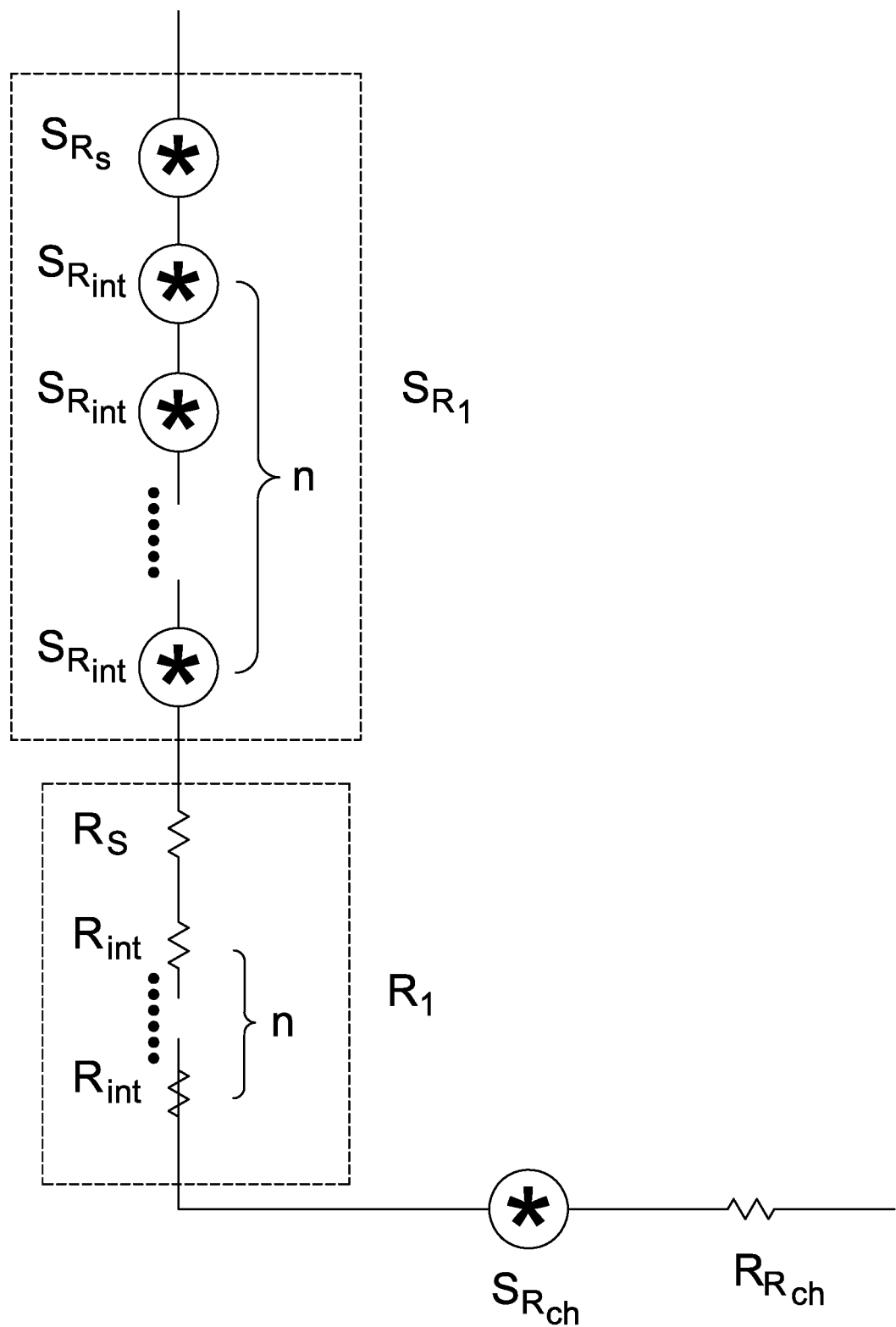
FIG. 6(d) is a schematic illustration of Thevenin equivalent resistance noise sources.
Figure 7:
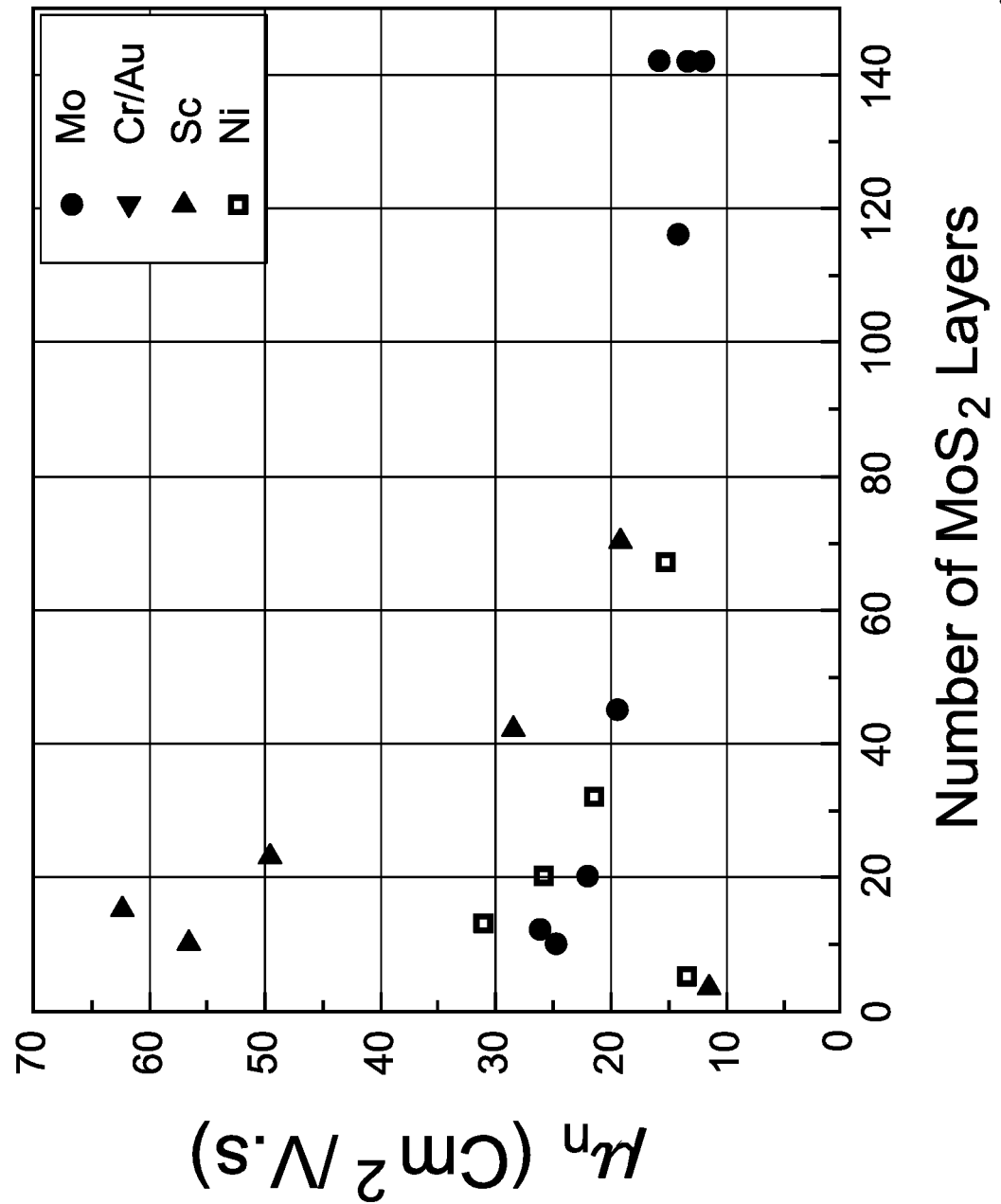
FIG. 7 is a summary of extrinsic mobilities of $MoS_2$ transistors with (chrome/gold, nickel, molybdenum, and scandium metal contacts). Highest mobility of 63 cm²/V·s is obtained with 15 atomic layer $MoS_2$ and with scandium contact. All other metals follow the similar trend, as well.
Figure 8:
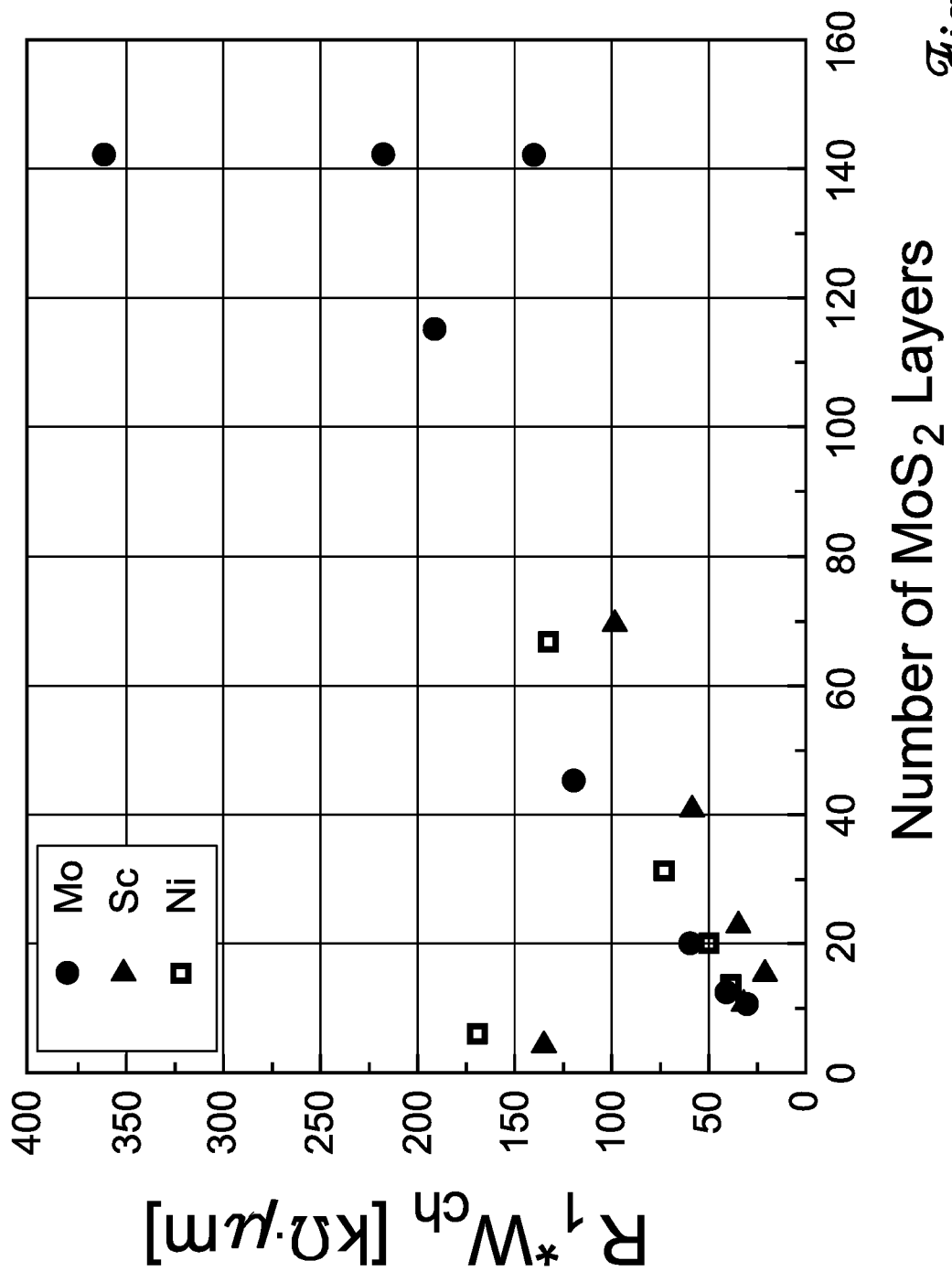
FIG. 8 is a summary of contact resistance with different metals and with different thickness (in terms of atomic layers) of $MoS_2$. 15 L transistor with scandium metal shows lowest contact resistance.
Figure 9:
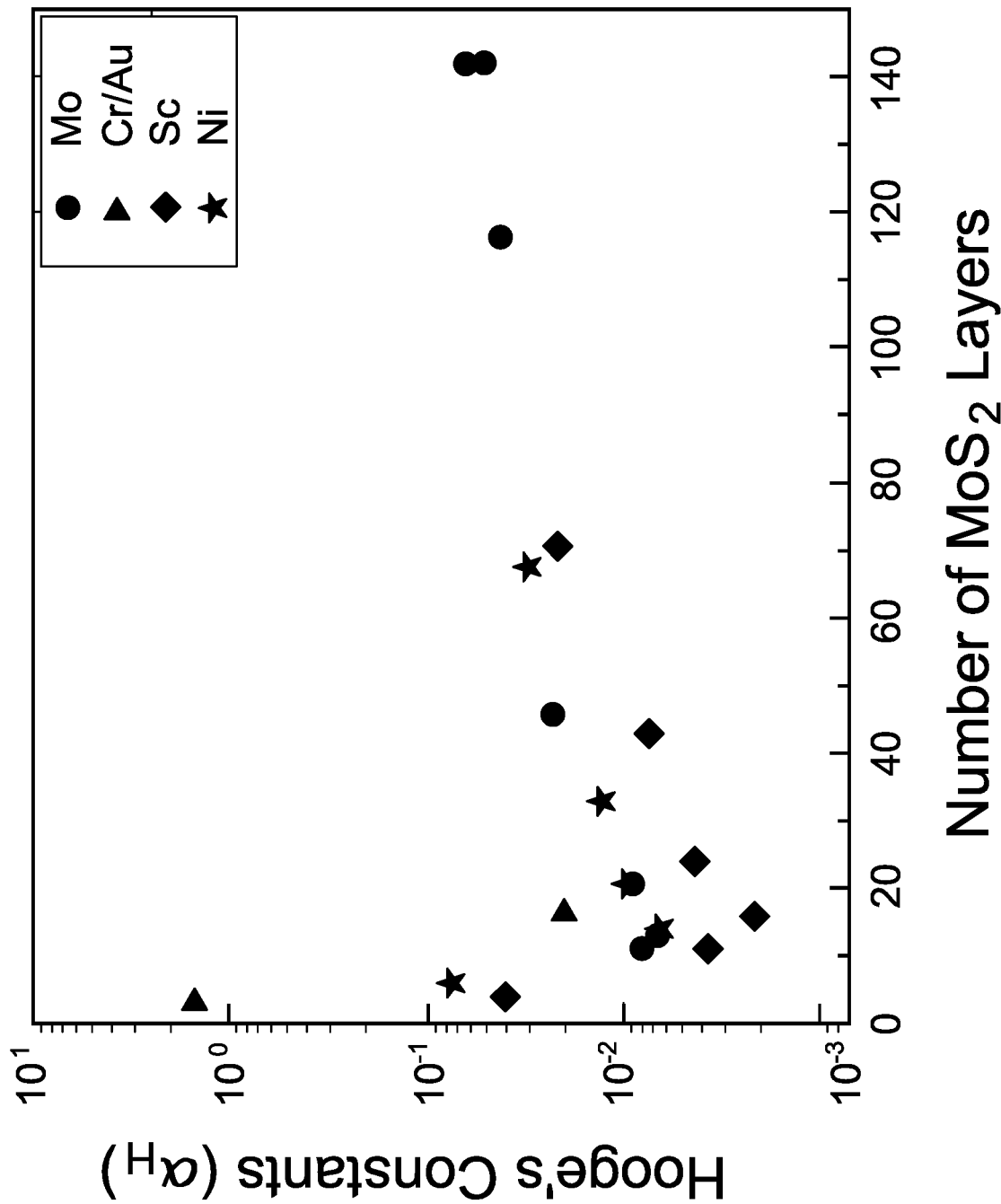
FIG. 9 is a summary of channel noise (in terms of characteristic Hooge parameters) with different metals and with different thickness (in terms of atomic layers) of $MoS_2$. 15 L transistor with scandium metal shows the lowest 1/f noise.
Figure 10:
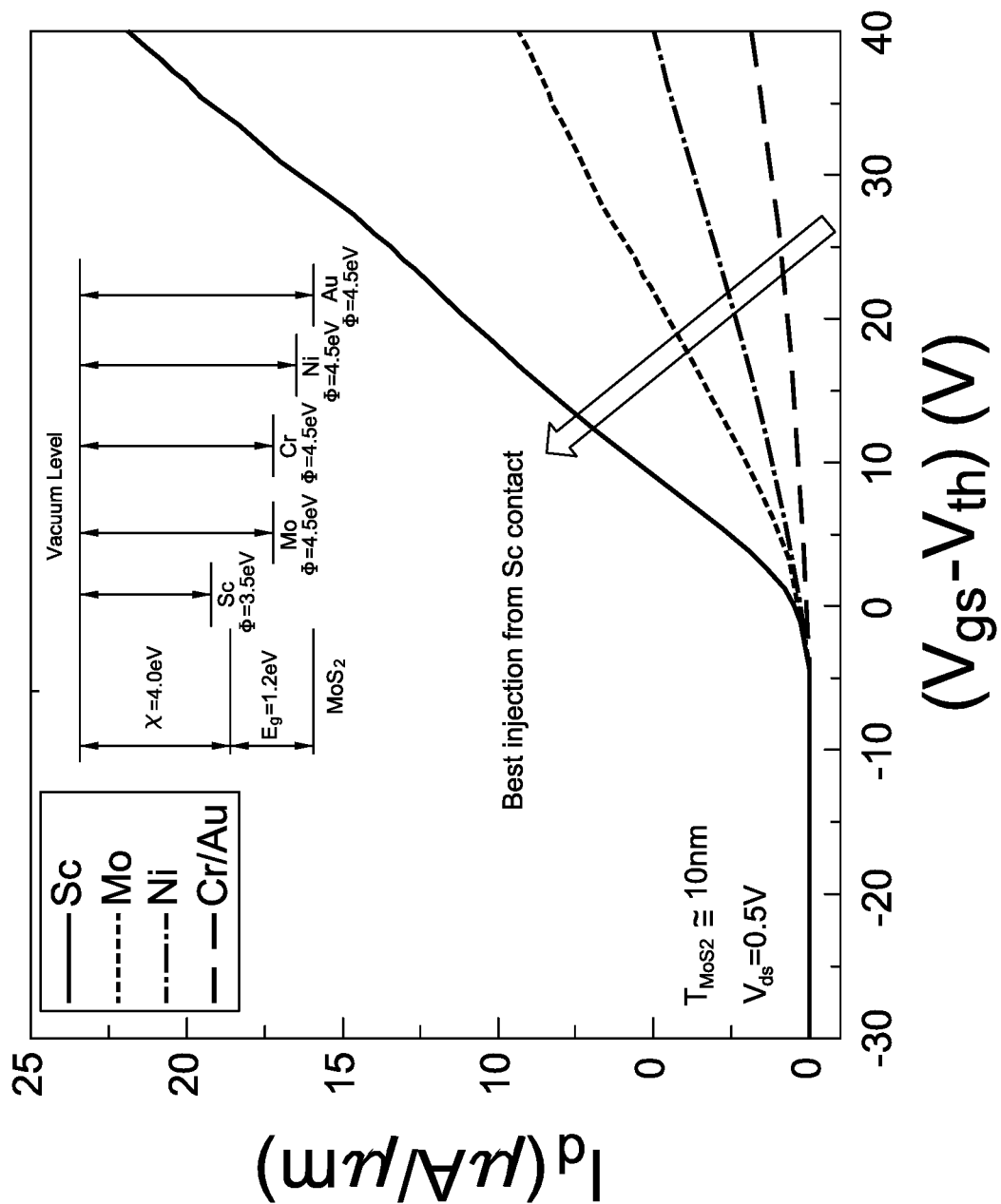
FIG. 10 is a summary of current injection (i.e., number of electron injection) to $MoS_2$ from various metal electrodes in 2D transistors. A systematic increase in injection current is achieved with chosen metals. This well aligns with the prediction on the basis of the metal work functions (inset schematic).

Using Eq. 8, the Hooge parameter, $\alpha_H$, (quantifying channel noise property and excluding effects of $R_1$ and $S_{R1}$) can be extracted from linear fitting within the channel-dominated regime, i.e. the region of FIG. 4(a) and FIG. 4(c) showing a slope of $\sim V_{gs}^{-1}$. This analysis yields an $\alpha_H$ value for each layer thickness. The corresponding values are tabulated in Table 1, along with values of $R_1$ and $S_{R1}$, which describe the contact/access resistance parameters. The Hooge's parameter vs. atomic layer number is shown in FIG. 6(b). Hooge's constants were extracted in voltage region in which the channel is dominating both noise and resistance, i.e. in which the term containing $S_{Rch}$ and $R_{ch}$ dominates. The Hooge parameter is considered to be a figure of merit for the channel region and should be independent of contact/access resistances. Broadly, the decrease in Hooge parameter with increasing layer thickness (3 L to 15 L) can be attributed to decreasing interactions of the channel charge with oxide/interface trap states. Beyond 15 L, the centroid of the channel distribution is not expected to change significantly, as evidenced by a relatively constant intrinsic mobility, so the Hooge parameter and the channel/interface trap interaction is expected to remain relatively constant. FIG. 6(c) illustrates the equivalent circuit model involving case of a channel noise current source ($S_{1ch}$) in series with noise current sources representing the metal/semiconductor contact ($S_{1S}$) and multiple interlayer resistances ($S_{Iint}$), along with the associated parallel resistances. To add such series sources, it is necessary to convert to Thevenin equivalent resistance noise sources, such as the one illustrated in the FIG. 6(d). The overall noise spectral power density is $S_{Rtotal} = S_{R1} + S_{Rch}$, where $S_{R1}$ is expressed as $S_{R1} = S_{Rs} + n \cdot S_{Rint}$. The overall resistance can be obtained by adding the series-connected resistances. Because the contact resistance and interlayer coupling resistance are not negligible, we model that both the contact and the interlayer resistances contribute to the measured noise.

Figure 5:
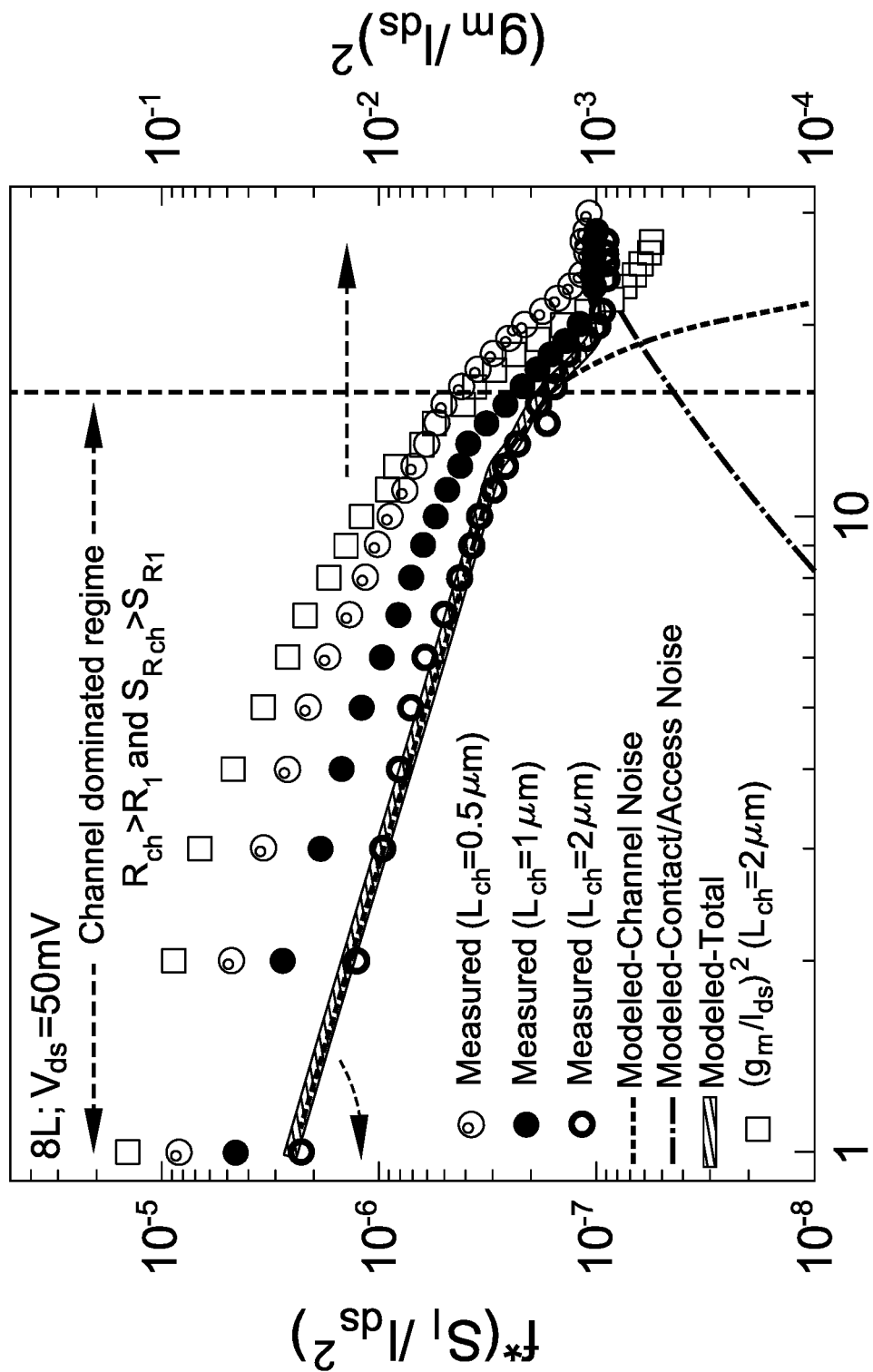
FIG. 5 is a comparison of the noise amplitudes ($f^*S_f/I_{ds}^2$) and $(g_m/I_{ds})^2$ as a function of overdrive voltage in 8 L $MoSe_2$ FETs. Pink (top), orange (middle) and black (bottom) circles represent the noise amplitude of $L_{ch}$=0.5 μm, 1 μm and 2 μm, respectively. The blue (negative slope) dashed line indicates the model fitting for the noise in the channel regime. The red (positive slope) dashed line indicates the model fitting for the noise in the contact regime. The opened square corresponds to $(g_m/I_{ds})^2$. Arrows indicate the appropriate axis.

In order to investigate the channel length dependence of the noise, 8 L MoSe$_2$ FETs were fabricated with different channel lengths ($L_{ch}$=0.5 µm, 1 µm and 2 µm) on the same flake. The dimensions and contact electrical parameters are presented in Table 1. Figure presents the measured noise amplitude versus ($V_{gs} \sim V_{th}$) for the devices, along with the model (channel noise term, contact noise term and total) corresponding to the 2 µm channel length. The measured $(g_m/I_d)^2$ relationship is also shown for the 2 µm channel length; as with the devices shown in FIG. 4, this relationship did not fit the experimental data as well as the model which considered Hooge model and contact effects. Using comparable analysis to that described previously, values of $S_{R1}$ and Hooge parameter are extracted for the devices and presented in Table 1. The observation of comparable Hooge parameters for devices with varying channel lengths is consistent with the behavior expected in a channel-dominated regime (as labeled in FIG. 5). Qualitatively similar results are also observed in 3 L FETs with different channel lengths. Since interface states are generally thought to be responsible for the noise, one would also expect a decreasing channel contribution to noise amplitude with increasing layer thickness. Although voltage-dependent noise has been observed to follow a carrier density fluctuation model, the noise amplitudes for few-layer devices for voltages just above threshold (as defined in the current study) are comparable to those observed in the 3 L and 5 L devices at comparable overdrive voltages in the current study. The devices in the current study employ a ~3× thinner SiO$_2$ gate dielectric, resulting in 3× the sheet carrier concentration at a given overdrive voltage and therefore operate in the metallic/diffusive limit even at modest overdrive voltages.

The present invention provides an improved understanding of the correlation between the electrical transport and 1/f noise studies in MoSe$_2$ FETs with varying channel layer thicknesses. The obtained mobility versus layer thickness of MoSe$_2$ FETs can be understood in terms of an intrinsic component associated with the channel and a component attributed to contact/interlayer coupling resistance, which both change with layer thickness. The gate-voltage dependence of the noise amplitude can be understood in terms of a voltage-dependent channel-dominated component and a voltage-independent contact/access dominated regime. A quantitative model is developed which adequately describes the observed voltage dependence, and which allows extraction of channel versus contact/access parameters for each layer thickness. A model considering both channel and contact/access resistance contributions can fit the observed voltage dependence for devices across the full range of layer thicknesses using only one mechanism (Hooge's mobility fluctuation). The Hooge's constant ($2.64 \times 10^{-3}$) extracted from the channel-dominated regime for the 15-layer device is comparable to values reported for reliable nanoscale FETs. Thus, the present invention enables and provides an improved semiconductor device that is smaller and demonstrates satisfactory electrical performance.

Although the invention has been described with reference to the embodiments illustrated in the attached drawing figures, it is noted that equivalents may be employed and substitutions made herein without departing from the scope of the invention as recited in the claims.

Having thus described various embodiments of the invention, what is claimed as new and desired to be protected by Letters Patent includes the following:

1. A semiconductor device comprising:
   a channel region including a compound having a transition metal and a chalcogen;
   at least a first and second electrode in contact with the channel region, the first and second electrodes comprising scandium;
   a resistive layer in contact with the channel region; and
   a third electrode in contact with the resistive layer,
   wherein the channel region has a thickness of about 3 to about 40 atomic layers.

2. The semiconductor device of claim 1, wherein the transition metal of the channel region comprises molybdenum.

3. The semiconductor device of claim 1, wherein the chalcogen of the channel region comprises selenium or sulfur.

4. The semiconductor device of claim 1, the channel region having a first surface and a second opposed surface, wherein the first and second electrodes overlie at least a portion of the first surface of the channel region, and the resistive layer is in contact with the second surface of the channel region.

5. The semiconductor device of claim 4, wherein the third electrode comprises doped silicon.

6. The semiconductor device of claim 5, wherein the resistive layer comprises silicon.

7. The semiconductor device of claim 6, wherein the resistive layer comprises silicon dioxide.

8. The semiconductor device of claim 1, wherein when a biasing voltage of from 50 to 500 mV is applied between the first electrode and the second electrode and a gate voltage is applied between the third electrode and the second electrode an on-current is generated, when the biasing voltage is applied between the first electrode and the second electrode and no gate voltage is applied an off-current is generated, wherein the ratio of the on-current to the off-current is at least 75,000.

9. The semiconductor device of claim 8, wherein the biasing voltage is about 150 to about 250 mV.

10. The semiconductor device of claim 1, wherein the channel region has a thickness of about 8 to about 20 atomic layers.

11. The semiconductor device of claim 1, wherein the channel region has a thickness that is less than 15 nm.

12. The semiconductor device of claim 1, wherein the semiconductor device is a transistor or a Schottky-barrier field-effect transistor.

13. The semiconductor device of claim 1, wherein the semiconductor device has a Hooge constant that is less than 0.01.

14. A semiconductor device comprising:
   a channel region having a first surface and a second opposed surface and comprising a compound having a transition metal and a chalcogen, the chalcogen comprising a material selected from the group consisting of: selenium and sulfur;
   a first electrode and a second electrode in contact with the first surface of the channel region, the first and second electrodes comprising scandium;
   a resistive layer in contact with the second surface of the channel region;
   a third electrode in contact with the resistive layer; and
   wherein the channel region has a thickness of about 3 to about 40 atomic layers.

15. The semiconductor device of claim 14, wherein when a biasing voltage of from 50 to 500 mV is applied between the first electrode and the second electrode and a gate voltage is applied between the third electrode and the second electrode an on-current is generated, when the biasing voltage is applied between the first electrode and the second electrode and no gate voltage is applied an off-current is generated, wherein the ratio of the on-current to the off-current is at least 75,000.

16. The semiconductor device of claim 15, wherein the biasing voltage is about 150 to 250 mV.

17. The semiconductor device of claim 14, wherein the semiconductor device has a Hooge constant that is less than 0.01.

18. A method of providing a conductive path, the method comprising:
   providing a semiconductor device comprising—
      a channel region having a first surface and a second opposed surface and comprising a compound having a transition metal and a chalcogen,
      a first electrode and a second electrode in contact with the first surface of the channel region, the first and second electrodes comprising scandium;
      a resistive layer positioned below the second surface of the channel region,
      a third electrode in contact with the resistive layer, and
      wherein the channel region has a thickness of about 8 to about 20 atomic layers;
   applying a biasing voltage of about 50 to about 500 mV between the first electrode and the second electrode; and
   applying a gate voltage between the third electrode and the second electrode.

19. The method of claim 18, wherein the third electrode comprises doped silicon, wherein the resistive layer is in direct contact with the second side of the channel region, and wherein the resistive layer comprises silicon dioxide.

* * * * *